(12) United States Patent
Ogawa et al.

(10) Patent No.: US 7,915,076 B2
(45) Date of Patent: Mar. 29, 2011

(54) HYBRID MODULE AND METHOD OF MANUFACTURING THE SAME

(75) Inventors: Tsuyoshi Ogawa, Kanagawa (JP); Hirokazu Nakayama, Kanagawa (JP); Hirohito Miyazaki, Kanagawa (JP); Namiko Takeshima, Kanagawa (JP)

(73) Assignee: Sony Corporation, Tokyo (JP)

( * ) Notice: Subject to any disclaimer, the term of this patent is extended or adjusted under 35 U.S.C. 154(b) by 563 days.

(21) Appl. No.: 12/077,486

(22) Filed: Mar. 19, 2008

(65) Prior Publication Data

US 2008/0182366 A1    Jul. 31, 2008

Related U.S. Application Data

(62) Division of application No. 11/528,965, filed on Sep. 27, 2006, now abandoned.

(30) Foreign Application Priority Data

Oct. 11, 2005   (JP) ................................. 2005-296734

(51) Int. Cl.
  *H01L 21/00*   (2006.01)
(52) U.S. Cl. ......... 438/106; 438/107; 257/678; 257/684
(58) Field of Classification Search .................. 438/106, 438/107; 257/678, 684
  See application file for complete search history.

(56) References Cited

U.S. PATENT DOCUMENTS

| | | | | |
|---|---|---|---|---|
| 5,182,632 A * | 1/1993 | Bechtel et al. | ................ | 257/713 |
| 5,497,033 A * | 3/1996 | Fillion et al. | .................. | 257/723 |
| 6,864,570 B2 * | 3/2005 | Smith | ........................... | 257/703 |
| 6,885,099 B2 * | 4/2005 | Ogawa | ........................... | 257/701 |
| 6,919,226 B2 * | 7/2005 | Ogawa et al. | ................ | 438/108 |
| 2003/0068852 A1 * | 4/2003 | Towle et al. | ................ | 438/200 |

FOREIGN PATENT DOCUMENTS

| | | |
|---|---|---|
| JP | 07-007134 | 1/1995 |
| JP | 2000-106417 | 4/2000 |
| JP | 2004-193221 | 7/2004 |

\* cited by examiner

*Primary Examiner* — Bradley K Smith
*Assistant Examiner* — Alexander Belousov
(74) *Attorney, Agent, or Firm* — Robert J. Depke; Rockey, Depke & Lyons, LLC

(57) ABSTRACT

A hybrid module includes a silicon substrate having a plurality of part mounting openings formed therein, the plurality of part mounting openings composed of through holes, a plurality of mounted parts that are mounted in the part mounting openings such that input/output portion forming surfaces are substantially flush with a first main surface of the silicon substrate, a sealing layer that is formed of a sealing material filled into the part mounting openings and covers the mounted parts, with the input/output portion forming surfaces exposed from the first main surface of the silicon substrate, to fix the mounted parts in the part mounting openings, and a wiring layer that is formed on the first main surface of the silicon substrate, and has a wiring pattern connected to input/output portions that are provided on the input/output portion forming surfaces of the mounted parts exposed from the first main surface.

11 Claims, 18 Drawing Sheets

HYBRID MODULE AND METHOD OF MANUFACTURING THE SAME

CROSS REFERENCES TO RELATED APPLICATIONS

The subject matter of application Ser. No. 11/528,965, is incorporated herein by reference. The present application is a Divisional of U.S. Ser. No. 11/528,965, filed Sep. 27, 2006 now abandoned, which claims priority to Japanese Patent Application JP 2005-296734 filed in the Japanese Patent Office on Oct. 11, 2005, the entire contents of which being incorporated herein by reference.

BACKGROUND OF THE INVENTION

1. Field of the Invention

The present invention relates to a hybrid module having a silicon substrate on which parts, such as optical elements, electronic parts, or semiconductor circuit devices including a plurality of integrated circuits (ICs), LSI (large-scale integration) elements, and memory devices are mounted and a wiring layer formed therein, and to a method of manufacturing the hybrid module.

2. Description of the Related Art

For example, various electronic apparatuses, such as a personal computer, a cellular phone, a video recorder, and an audio apparatus, are provided with electronic parts or semiconductor circuit devices, such as various types of IC elements, LSI elements, and memory devices. The electronic apparatus is provided with a hybrid module including a base substrate having the semiconductor circuit devices or the electronic parts having the same function formed therein and a wiring layer on the base substrate.

In the hybrid module, in order to realize a multi-function and high-performance electronic apparatus having a small size, a plurality of mounted parts are provided in the silicon substrate, which enables the hybrid module to have a high degree of integration, a small size, and light weight. For example, JP-A-7-7134 and JP-A-2000-106417 disclose a hybrid module in which a plurality of mounted parts are sealed in a resin substrate such that input/output portion forming surfaces are flush with each other and a wiring layer is formed on the main surface of the resin substrate. The hybrid module is configured such that other parts can be mounted on the mounted parts with the wiring layer interposed therebetween, which makes it possible to realize a hybrid module having a small thickness and a high degree of integration.

Meanwhile, in the electronic apparatuses, signal transmission between the parts mounted in a board is generally performed by a wiring pattern formed on the wiring layer. In the electronic apparatuses, high-speed signal processing has been demanded. However, it is difficult to achieve the high-speed signal processing in the electrical signal transmission method using the wiring pattern due to, for example, a limitation in minutely forming the wiring pattern, delay in the transmission of a signal caused by a CR (capacitance-resistance) time constant generated in the wiring pattern, EMI (electromagnetic interference), EMC (electromagnetic compatibility), and cross talk between wiring patterns.

In the electronic apparatuses, in order to solve the problem caused by the electric signal transmission structure and to realize a high-speed, multi-function, and high-performance hybrid module, an optical signal transmission structure including an optical component, such as an optical interconnection component or an optical signal transmitting path (optical bus), has been examined. The optical signal transmission structure is suitable for relatively-short-distance signal transmission between apparatuses, between boards provided in the apparatuses, or between parts mounted in the boards. In the optical signal transmission structure, the optical signal transmitting path is formed in the wiring substrate having parts mounted therein, and the optical signal transmitting path is used as a transmission path, which makes it possible to transmit optical signals in large quantities at high speed. For example, JP-A-2004-193221 discloses a hybrid module provided with an optical element.

SUMMARY OF THE INVENTION

In the hybrid modules disclosed in JP-A-7-7134 and JP-A-2000-106417, a plurality of mounted parts, such as semiconductor chips or functional devices, are mounted in a line on a base sheet supported by a base, and resin is applied onto the base sheet so as to seal the mounted parts, thereby forming a substrate. In the hybrid modules, the mounted parts are mounted such that contact pads thereof are flush with each other, which makes it possible to collectively connect the mounted parts to a circuit board, and the substrate is polished in accordance with the mounted part having a maximum size, thereby reducing the overall thickness of the hybrid module.

However, in the hybrid modules, since a plurality of mounted parts are sealed in the substrate formed of resin, the substrate is largely deformed due to hardening shrinkage occurring when the resin is hardened. In the hybrid modules, the substrate is largely bent due to the hardening shrinkage, which causes positional deviation between connection pads of the mounted parts and mounting lands of the circuit board or the breaking of wiring lines in the connecting portions, resulting in the deterioration of mounting accuracy. Further, in the hybrid modules, cracks occur in the outer circumferential portions of the mounted parts due to stress caused by thermal deformation, which causes the lowering of mounting strength, an internal short circuit due to the infiltration of water, or the occurrence of rust, resulting in low reliability.

Meanwhile, as disclosed in JP-A-2000-106417, since the hybrid module includes the optical signal transmission structure, it is possible to realize a high-speed, multi-function, and high-performance hybrid module. In the hybrid module, an electric signal input/output to/from, for example, an LSI element capable of processing signals in large quantities at high speed is converted into an optical signal by an optical element, such as a semiconductor laser, a light emitting diode, or a photodetector. Therefore, JP-A-2000-106417 provides a mixed-type hybrid module having both the electric signal transmission structure and the optical signal transmission structure.

In the mixed-type hybrid module, it is very important to reduce parasitic capacitance in the electric signal transmission structure by reducing delay in the transmission of signals caused by the CR time constant, EMI noise, and EMC, while transmitting signals at high speed through the optical signal transmission structure. In the mixed-type hybrid module, heat is generated when the optical element converts the electric signal into the optical signal, which may affect on characteristics of the electric parts.

Therefore, in the mixed-type hybrid module, generally, the optical element or the optical signal transmitting path is mounted on the main surface of the wiring layer or the circuit board by a separate process. In the mixed-type hybrid module, a mounting process is complicated, and the manufacturing efficiency is lowered, which results in a low manufacturing yield. In the mixed-type hybrid module, since the electric parts are separately mounted from the optical elements, an electric wiring pattern for connecting the parts is needed, and connection capacitance makes it difficult to reduce the parasitic capacitance.

Accordingly, it is desirable to provide a hybrid module capable of mounting a plurality of parts with a small thickness and of improving mounting accuracy and mounting efficiency, thereby improving reliability, and a method of manufacturing the hybrid module.

According to an embodiment of the invention, a hybrid module includes: a silicon substrate having a plurality of part mounting openings formed therein, the plurality of part mounting openings composed of through holes; a plurality of mounted parts that are mounted in the part mounting openings such that input/output portion forming surfaces are substantially flush with a first main surface of the silicon substrate; a sealing layer that is formed of a sealing material filled into the part mounting openings in which the mounted parts are mounted, and covers the mounted parts, with the input/output portion forming surfaces exposed from the first main surface of the silicon substrate, to fix the mounted parts in the part mounting openings; and a wiring layer that is formed on the first main surface of the silicon substrate, and has a wiring pattern connected to input/output portions that are provided on the input/output portion forming surfaces of the mounted parts exposed from the first main surface.

In the hybrid module according to the above-mentioned embodiment, since the silicon substrate is used as a base substrate, the part mounting openings and the wiring layer are relatively easily formed with high accuracy, and are hardly deformed due to, for example, heat. Therefore, the mounted parts are accurately mounted in the silicon substrate, and are reliably connected to, for example, the wiring layer, which results in high reliability. Further, in the hybrid module, the silicon substrate serves as the ground of the mounted parts or the wiring layer, and also has a function of dissipating heat, which makes it possible for the hybrid module to stably operate. In the hybrid module, the mounted parts having different sizes are mounted in the silicon substrate with the input/output portion forming surfaces thereof being flush with each other. Therefore, it is possible to reduce the size and thickness of the hybrid module, and to connect the mounted parts to the wiring layer through vias, not bumps, at the shortest distance, thereby reducing the parasitic capacitance.

According to another embodiment of the invention, a method of manufacturing a hybrid module includes: a part mounting opening forming step of forming in a silicon substrate a plurality of part mounting openings composed of through holes passing through first and second main surfaces of the silicon substrate; a mounted part integrating step of integrating the mounted parts with the silicon substrate by mounting the mounted parts in the part mounting openings such that input/output portion forming surfaces are substantially flush with the first main surface of the silicon substrate; and a wiring layer forming step of forming a wiring layer on the first main surface of the silicon substrate so as to cover the mounted parts. The method manufactures a hybrid module in which the mounted parts are mounted in the part mounting openings such that the input/output portion forming surfaces are exposed from the first main surface of the silicon substrate in a state in which they are flush with the first main surface of the silicon substrate.

In the method of manufacturing a hybrid module according to the above-mentioned embodiment, the mounted part integrating step includes: a silicon substrate mounting step; a part mounting step; a sealing layer forming step, and a peeling step. In the method of manufacturing a hybrid module, in the silicon substrate mounting step, the silicon substrate is bonded to a dummy substrate, using the first main surface thereof as a bonding surface, such that portions of the part mounting openings exposed from the first main surface are blocked. In the method of manufacturing a hybrid module, in the part mounting step, the mounted parts are mounted in the part mounting openings of the silicon substrate from the second main surface, using the input/output portion forming surfaces as mounting surfaces, such that the input/output portion forming surfaces are substantially flush with each other on the dummy substrate. In the method of manufacturing a hybrid module, in the sealing layer forming step, after a sealing material, such as an adhesive resin, is filled into the part mounting openings, the sealing material is hardened by a hardening process to form a sealing layer, so that the mounted parts are fixed in the part mounting openings by the sealing layer. In the method of manufacturing a hybrid module, in the peeling step, the silicon substrate is peeled from the dummy substrate. In this way, the manufacturing method manufactures an intermediate in which the mounted parts are mounted in the part mounting openings such that the input/output portion forming surfaces thereof are flush with the first main surface of the silicon substrate.

In the method of manufacturing a hybrid module, the silicon substrate that is hardly deformed due to heat is used as a base substrate, and a plurality of part mounting openings are accurately and effectively formed in the silicon substrate by, for example, etching. Then, the mounted parts are accurately mounted in the part mounting openings. In this way, the mounted parts are integrated with the silicon substrate. According to the method of manufacturing a hybrid module, the mounted parts are reliably connected to the wiring layer, and thus the breaking of wiring lines is prevented, which makes it possible to manufacture a hybrid module having high reliability. According to the method of manufacturing a hybrid module, the silicon substrate serves as the ground of the mounted parts or the wiring layer, and also has a function of dissipating heat, which makes it possible to manufacture a hybrid module capable of stably operating. According to the method of manufacturing a hybrid module, since the silicon substrate having the mounted parts mounted therein is attached to another member, it is possible to reduce the size and thickness of the silicon substrate and to connect the mounted parts to the wiring layer at the shortest distance, resulting in a reduction in parasitic capacitance. As a result, it is possible to effectively manufacture a multi-function and high-performance hybrid module having a high degree of integration.

According to the above-mentioned embodiments of the invention, the mounted parts are mounted in the part mounting openings formed in the silicon substrate such that the input/output portion forming surfaces are substantially flush with the main surface of the silicon substrate, the mounted parts are sealed by the sealing layer to be integrated with the silicon substrate, and the wiring layer electrically connected to the mounted parts is formed on the main surface of the silicon substrate, thereby forming a hybrid module. Therefore, according to the embodiment of the invention, it is possible to reduce the thickness and size of a hybrid module, and to reduce parasitic capacitance by connecting the mounted parts to the wiring layer at the shortest distance. According to the embodiment of the invention, it is possible to obtain a high-accuracy hybrid module in which the silicon substrate that is hardly deformed due to, for example, heat is used as a base substrate, the mounted parts are accurately mounted in the part mounting openings of the silicon substrate to be integrated with the silicon substrate, and the breaking of wiring line is prevented between the wiring layer and the mounted parts. According to the embodiment of the invention, since the silicon substrate serves as a power supply portion or a ground portion of the mounted parts or the wiring layer and also has a function of dissipating heat, it is possible to obtain a hybrid module that is stably operated and thus has high reliability.

DESCRIPTION OF THE PREFERRED EMBODIMENTS

Figure 1:
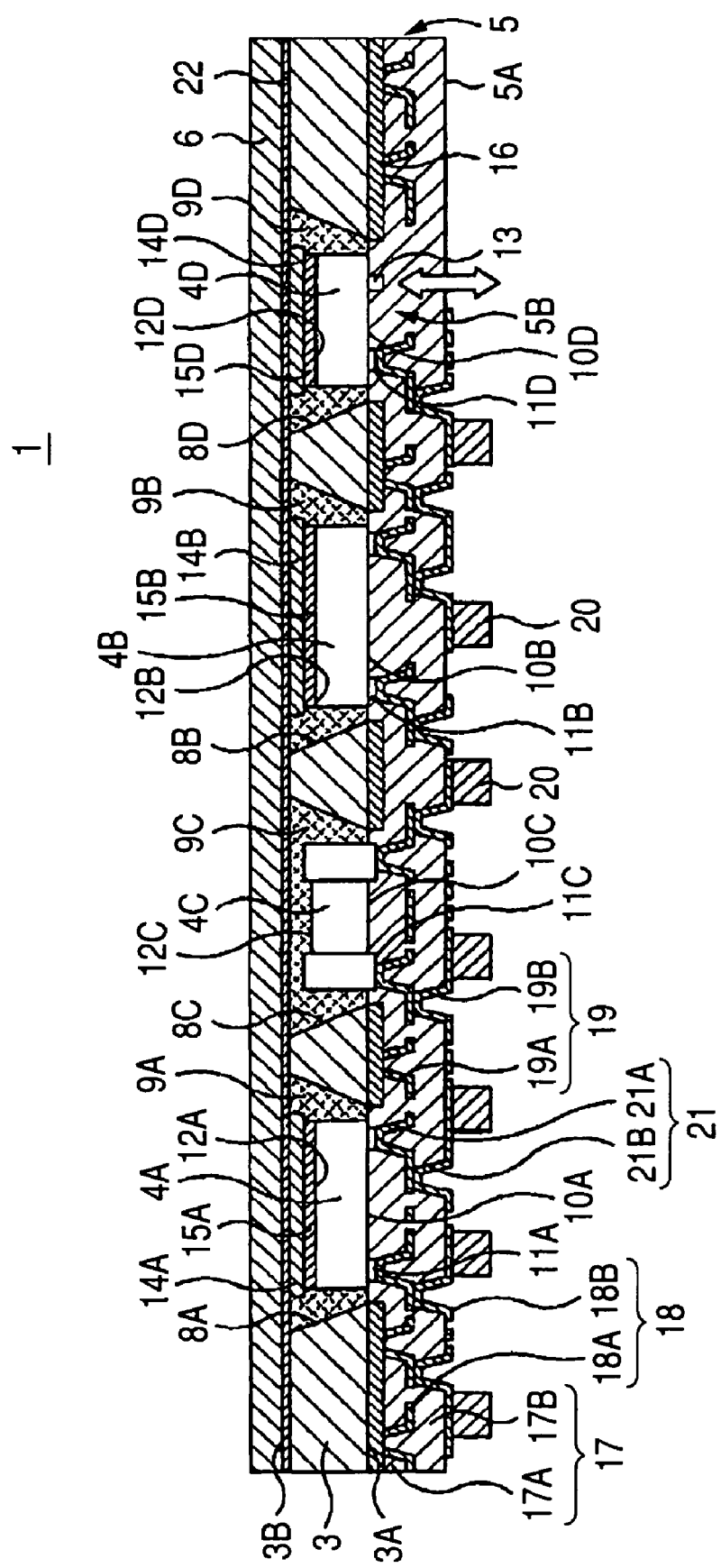
FIG. 1 is a cross-sectional view of a hybrid module according to an embodiment of the invention.

Hereinafter, a hybrid module 1 and a hybrid circuit device 2 provided with the hybrid module 1 according to an embodiment of the invention will be described in detail with reference to the accompanying drawings. As shown in FIG. 1, the hybrid module 1 is formed of a laminated structure including a silicon substrate 3 having a plurality of mounted parts 4A and 4D provided therein (hereinafter, the mounted parts 4A and 4D are generally referred to as mounted parts 4 except when the mounted parts 4A and 4B are individually described), a wiring layer 5 bonded to a first main surface 3A of the silicon substrate 3, and a heat dissipating plate 6 bonded to a second main surface 3B of the silicon substrate 3. The hybrid module 1 uses the silicon substrate 3 that is polished such that the thickness thereof is slightly larger than the thickness of the mounted part 4, which will be described later, resulting in a reduction in the thickness of the hybrid module 1.

Figure 2:
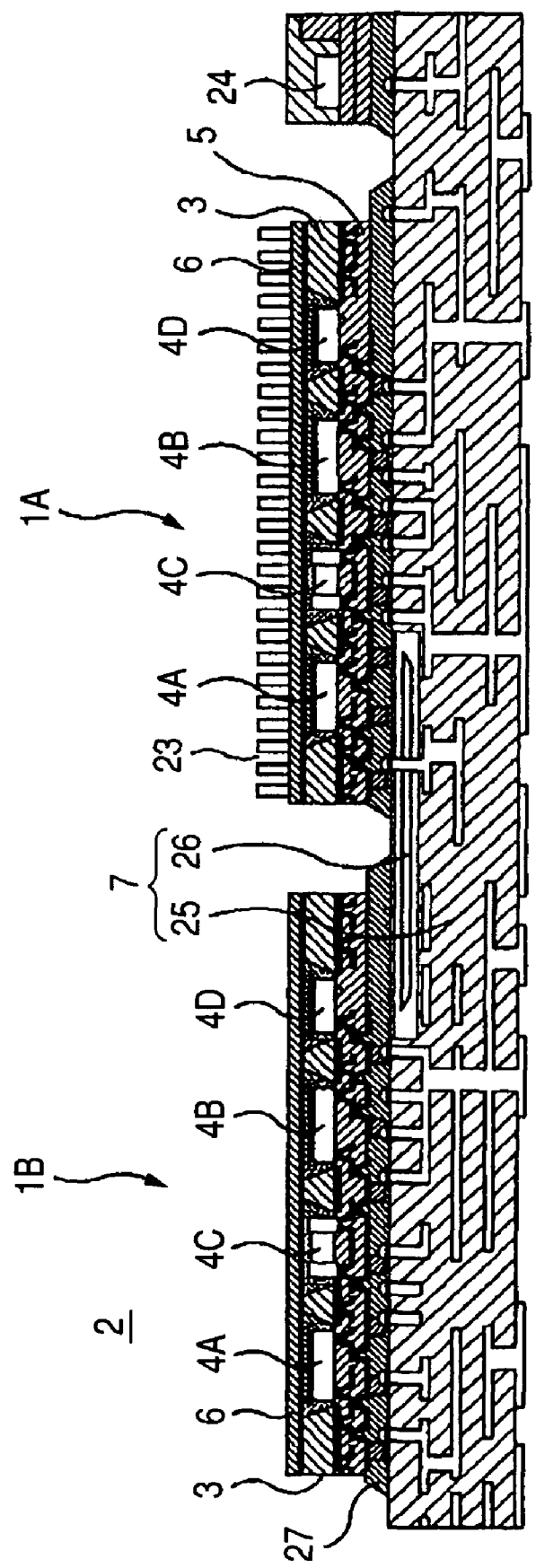
FIG. 2 is a cross-sectional view of a hybrid circuit device provided with the hybrid module.

As shown in FIG. 2, the hybrid module 1 is mounted to a base substrate portion 7, which will be described later in detail, using the wiring layer 5 as a mounting surface, thereby forming the hybrid circuit device 2. In the hybrid circuit device 2, the base substrate portion 7 is mounted to, for example, a mother board or an interposer. The hybrid circuit device 2 is provided in various electronic apparatuses, such as a personal computer and a cellular phone. The hybrid circuit device 2 provided with the hybrid module 1 includes an electrical wiring structure for transmitting/receiving electrical control signals or data signals or supplying power and an optical wiring structure for transmitting/receiving optical control signals or data signals, and processes a large amount of control signals or data signals at high speed.

In the hybrid module 1, for example, the mounted parts 4 including electronic parts, such as first and second LSIs 4A and 4B operatively associated with each other and semiconductor devices 4C, and optical elements 4D are mounted on the silicon substrate 3. The first and second LSIs 4A and 4B (a detailed description thereof will be omitted) are multi-pin LSIs capable of processing a large amount of signals at high speed. The semiconductor devices 4C are electronic parts, such as semiconductor memories, various types of semiconductor devices, and decoupling capacitors. The optical elements 4D are light emitting elements, such as semiconductor lasers or light emitting diodes, that are controlled by the first and second LSIs 4A and 4B or the semiconductor devices 4C to emit optical signals, or light receiving elements, such as photodetector. The optical elements 4D may be optical elements having both a light emitting function and a light receiving function.

In the hybrid module 1, as will be described later, the mounted parts 4 are provided in first to fourth part mounting openings 8A to 8D formed in the silicon substrate 3 (hereinafter, the first to fourth part mounting openings 8A to 8D are generally referred to as part mounting openings 8 except when the first to fourth part mounting openings 8A to 8D are individually described), and are sealed by first to fourth sealing resin layers 9A to 9D (hereinafter, the first to fourth sealing resin layers 9A to 9D are generally referred to as sealing resin layers 9 except when the first to fourth sealing resin layers 9A to 9D are individually described). In this way, the mounted parts 4 are integrated with the silicon substrate 3. Although several kinds of mounted parts 4 are provided one by one in the hybrid module 1 in FIGS. 1 and 2, a predetermined number of mounted parts for every kind of parts may be provided therein.

A predetermined number of input/output pads 11A and 11D (hereinafter, the input/output ports 11A to 11D are generally referred to as input/output pads 10 except when the input/output pads 11A to 11D are individually described) for inputting/outputting electric signals (whose detailed description will be omitted) are formed on first main surfaces 10A to 10D of the mounted parts 4 (hereinafter, the first main surfaces 10A to 10D are generally referred to as input/output portion forming surfaces 10 except when the first main surfaces 10A to 10D are individually described), thereby forming the input/output portion forming surfaces 10. As described above, since different kinds (different characteristics) of mounted parts 4 are provided, the sizes and specifications of the mounted parts 4 are different from each other.

As will be described later, the mounted parts 4 are provided in the corresponding part mounting openings 8 with the input/output portion forming surfaces 10 thereof used as mounting surfaces. The heat dissipating plate 6 is laminated on second main surfaces 12A to 12D (hereinafter, the second main surfaces 12A to 12D are generally referred to as bottom surfaces 12 except when the second main surfaces 12A to 12D are individually described) of the mounted parts 4 opposite to the input/output portion forming surfaces 10. An input/output pad 11D and an optical signal input/output portion 13 composed of a light emitting part for emitting optical signals or a light receiving part for receiving the optical signals are provided on the input/output portion forming surface 10D of each optical element 4D.

In the hybrid module 1, the mounted parts 4 generating heat, such as the first and second LSIs 4A and 4B and the optical element 4D, are provided in the silicon substrate 3 and are then sealed by the sealing resin layer 9. In addition, in the hybrid module 1, individual heat dissipating plates 14A, 14B, and 14D (hereinafter, the heat dissipating plates 14A, 14B, and 14D are generally referred to as individual heat dissipating plates 14 except when the heat dissipating plates 14A, 14B, and 14D are individually described) are provided to the mounted parts 4, if necessary, in order to effectively transmit heat generated from the mounted parts 4 to the heat dissipating plate 6 and to dissipate the heat.

For example, metal plates, such as copper plates or aluminum plates, or silicon plates having light weight and high heat conductivity are used for the individual heat dissipating plates 14. The metal plate or the silicon plate has a size equal to or slightly larger than that of the mounted part 4 (4A, 4B, or 4D). The individual heat dissipating plates 14 are bonded to the bottom surfaces 12 of the corresponding mounted parts 4 by insulating adhesives 15A, 15B, and 15D. The individual heat dissipating plate 14 may protrude from the part mounting opening 8 when it is bonded to the mounted part 4, or it may be polished by a polishing process, which will be described later, to be flush with the second main surface 3B of the silicon substrate 3. In this embodiment, the individual heat dissipating plates 14 are bonded to the mounted parts 4 by the insulating adhesives 15A, 15B, and 15D, but they may be bonded to the mounted parts 4 by, for example, an anode bonding method.

An etching process, which will be described later, is performed on the first main surface 3A and the second main surface 3B of the silicon substrate 3 in the thickness direction thereof to form in the silicon substrate 3 the part mounting openings 8 having sizes suitable for the insertion of the corresponding mounted parts 4. As described above, since the silicon substrate 3 is thinned down to a predetermined thickness beforehand by polishing, it is possible to form the part mounting openings 8 with a high degree of efficiency and high accuracy. The part mounting openings 8 may be formed by forming concave portions corresponding to the part mounting openings 8 in the second main surface 3B of the silicon substrate 3 with a predetermined depth and by polishing the bottom surfaces of the concave portions. In this way, the first main surface 3A is also formed.

The part mounting opening 8 is formed as an opening in the silicon substrate 3 in a trapezoidal shape in sectional view in which an upper surface positioned on the second main surface 3B, which is an etching surface, has a larger diameter and the diameter is tapered toward the first main surface 3A. Such a trapezoidal shape in sectional view of the part mounting opening 8 allows a sealing resin forming the sealing resin layer 9 to easily flow from the second main surface 3B into a circumferential portion of the mounted part 4 provided therein.

The sealing resin layer 9 is formed by filling a thermosetting adhesive resin material, such as epoxy-based resin, into the part mounting opening 8 and by hardening the adhesive resin material by a curing process, which causes the mounted parts 4 to be integrated with the silicon substrate 3 in the part mounting openings 8. As described later, the sealing resin layer 9 is formed with a thickness suitable for covering all the mounted parts 4 bonded to the individual heat dissipating plates 14 or the silicon substrate 3, and is then polished together with the individual heat dissipating plates 14 until the second main surface 3B is exposed.

In the hybrid module 1, as shown in FIG. 1, the input/output portion forming surfaces 10 of the mounted parts 4 are flush with each other and are also flush with the first main surface 3A of the silicon substrate 3 by a mounted part integrating process, which will be described later. In addition, the mounted parts 4 are provided in the part mounting openings 8 and are then sealed by the sealing resin layer 8, thereby being integrated with the silicon substrate 3. In the hybrid module 1, the input/output portion forming surfaces 10 of the mounted parts 4 are exposed from the sealing resin layer 9 on the side of the first main surface 3A and faces toward the outside from the part mounting opening 8, so that the mounted parts 4 are directly connected to the wiring layer 5, which will be described later, formed on the first main surface 3A of the silicon substrate 3.

A conductive layer 16 having a thickness substantially equal to the height of the input/output pad 11 of the mounted part 4 is formed on the first main surface 3A of the silicon substrate 3. The conductive layer 16 is formed of, for example, copper, and reliably electrically connects the silicon substrate 3 to the wiring layer 5, causing the silicon substrate 3 to function as a power supply portion or a ground portion. More specifically, in the hybrid module 1, the input/output pad 11 provided on the input/output portion forming surface 10 is formed so as to be substantially flush with the conductive layer 16 formed on the first main surface 3A, so that the mounted part 4 is buried in the part mounting opening 8 of the silicon substrate 3. The conductive layer 16 may not be formed in the hybrid module 1.

In the hybrid module 1, the wiring layer 5 is formed on the first main surface 3A of the silicon substrate 3 in order to cover the mounted parts 4. The wiring layer 5 is formed by a general multi-layer wiring technique, and includes a first insulating resin layer 17A and a second insulating resin layer 17B (hereinafter, the first and second insulating resin layers 17A and 17B are generally referred to as insulating resin layers 17 except when the first and second insulating resin layers 17A and 17B are individually described), a first wiring pattern 18A and a second wiring pattern 18B (hereinafter, the first and second wiring patterns 18A and 18B are generally referred to as wiring patterns 18 except when the first and second wiring patterns 18A and 18B are individually described), and a plurality of first vias 19A and a plurality of second vias 19B (hereinafter, the first and second vias 19A and 19B are generally referred to as vias 19 except when the first and second vias 19A and 19B are individually described). The wiring layer 5 is formed by the wiring pattern 18 and a copper pattern obtained by performing a copper plating process on the vias 19. A plurality of bumps 20 are provided at predetermined positions on a surface 5A of the wiring layer 5, which is a mounting surface to the base substrate portion 7. In this embodiment, in the wiring layer 5, two wiring pattern layers 18 are formed on the insulating resin layer 17. However, one wiring pattern layer 18 or three or more wiring pattern layers 18 may be formed on the insulating resin layer 17.

In the wiring layer 5, the insulating layer 17 is formed of a light-transmitting insulating resin material having a photosensitive property, such as epoxy-based resin, polyimide resin, acrylic-based resin, polyolefin-based resin, or rubber-based resin. The insulating layer 17 may be formed of a light-transmitting insulating resin having a good high-frequency characteristic, such as benzocyclobutene resin.

In the wiring layer 5, the first vias 19A and the first wiring pattern 18A are formed in the first insulating resin layer 17A, and the second vias 19B and the second wiring pattern 18B are formed in the second insulating resin layer 17B. As described later, in the wiring layer 5, a conductive process is performed on a plurality of first via holes 21A that are formed by facing the conductive layer 16 and the input/output pads 11 of the mounted parts 4 to the outside to form the first vias 19A in the first insulating resin layer 17A, and the input/output pads 11 and the conductive layer 16 are directly connected to the first wiring pattern 18A through the first vias 19A.

In the wiring layer 5, the first wiring pattern 18A is formed on the first insulating resin layer 17A to form the second insulating resin layer 17B. In the wiring layer 5, a conductive process is performed on a plurality of second via holes 21B that are formed by facing lands of the first wiring pattern 18A to the outside to form the second vias 19B in the second insulating resin layer 17B. In the wiring layer 5, the first wiring pattern 18A is directly connected to the second wiring pattern 18B through the second vias 19B.

In the hybrid module 1, as described above, the mounted parts 4 buried in the silicon substrate 3 is directly connected to the wiring pattern 18 of the wiring layer 5 through the vias 19, without, for example, bumps. Therefore, in the hybrid module 1, it is possible to reduce the length of wiring lines, parasitic capacitance in the connecting portions, delay in the transmission of signal due to a CR time constant, EMI noise, and EMC, thereby improving characteristics.

In the hybrid module 1, as described later, the wiring layer 5 is formed on the first main surface 3A of the flat silicon substrate 3. Therefore, in the hybrid module 1, it is possible to form a minute and high-accuracy wiring layer 5 by a so-called semiconductor process, and thus to provide thin-film passive elements, such as a capacitive element, a resistive element, and an inductive element, in a layer. In the hybrid module 1, since the passive elements corresponding to chip components of a related art are provided in the wiring layer 5, it is possible to reduce the length, width, and size of wiring lines and to achieve a high degree of integration.

As described above, in the wiring layer 5, the insulating layer 17 is formed of a light-transmitting insulating resin, and thus the insulating layer 17 is formed as an optical signal transmitting path with respect to the optical element 4D. That is, a portion of the wiring layer 5 opposite to the optical signal input/output portion 13 of the optical element 4D corresponds to a portion in which the wiring pattern 18 is not formed over the entire region of the insulating layer 17 in the thickness direction, thereby forming an optical signal transmitting path 5B.

In the wiring layer 5, as represented by the arrow in FIG. 1, an optical signal emitted from the optical signal input/output portion 13 of the optical element 4D travels along the optical signal transmitting path 5B and is emitted from the surface 5A. In the wiring layer 5, an optical signal incident on the surface 5A travels through the optical signal transmitting path 5B and is then incident on the optical signal input/output portion 13 of the optical element 4D. In the hybrid module 1, a portion of the wiring layer 5 is formed as the optical signal transmitting path 5B. However, in order to more effectively transmit the optical signal, an optical waveguide member formed by coating a conductive member formed of a transparent resin material, which is a core, with a clad material may be provided opposite to the optical signal input/output portion 13 of the optical element 4D.

The bumps 20 are formed on the lands of the second wiring pattern 18B with a predetermined height by, for example, a metal plating method. The hybrid module 1 is mounted on the base substrate portion 7 in a flip chip manner, thereby forming the hybrid circuit device 2 shown in FIG. 2. The bumps 20 may have an appropriate structure according to a method of mounting the hybrid module 1 to the base substrate portion 7, and the bumps 20 may be, for example, solder balls or metal balls provided on the lands of the second wiring pattern 18B.

The heat dissipating plate 6 is formed of a silicon plate or a metal plate having a light weight and high heat conductivity, such as a copper plate or an aluminum plate, and is bonded to the entire second main surface 3B of the silicon substrate 3 by an adhesive layer 22. As described above, since the second main surface 3B of the silicon substrate 3 or the individual heat dissipating plates 14 bonded to the mounted parts 4 are planarized by the polishing process, the heat dissipating plate 6 is closely adhered to the second main surface 3B or the individual heat dissipating plates 14 all over, which makes it possible to dissipate heat with a high degree of efficiency.

As described above, the part mounting opening 8 is formed in a trapezoidal shape in sectional view in which one surface thereof adjacent to the second main surface 3B has a larger diameter, and the silicon substrate 3 has a small thickness. Therefore, when the sealing resin is not sufficiently hardened, adhesion between the sealing resin layer 9 and the silicon substrate 3 may become weak, and thus the sealing resin layer 9 and the mounted parts 4 may be detached from the silicon substrate 3, or they may deviate from the silicon substrate 3 during the polishing process. The heat dissipating plate 6 is bonded to the silicon substrate 3 so as to block the part mounting openings 8 in the second main surface 3B, which causes the mounted parts 4 or the sealing resin layer 9 to be reliably fixed in the part mounting openings 8. The heat dissipating plate 6 is attached to the silicon substrate 3 having a small thickness to improve the mechanical rigidity of the silicon substrate 3.

In the hybrid module 1, a heat radiating structure for dissipating heat generated from the mounted parts 4 is formed by bonding the individual heat dissipating plates 14 to the mounted parts 4 and the heat dissipating plate 6 to the silicon substrate 3. However, when heat generated from the mounted parts 4 is not very much, the heat dissipating plate 3 and the individual heat dissipating plates 14 may not be provided. As shown in FIG. 2, in order to more effectively dissipate heat, a heat spreader 23 may be bonded to the heat dissipating plate 6 of the hybrid circuit device 2 where the hybrid module 1 and the base substrate portion 7 are bonded to each other.

As described above, in the hybrid module 1, the mounted parts 4 buried in the silicon substrate 3 are electrically connected to each other through the wiring pattern 18 of the wiring layer 5. In the hybrid module 1, power is supplied to the light emitting element 4D through the wiring layer 5. Then, the light emitting element 4D converts an electric signal output from the first LSI 4A or the second LSI 4B into an optical signal or converts the optical signal into the electric signal and supplies the converted signal to the first LSI 4A or the second LSI 4B. In the hybrid module 1, an electronic component, such as the first LSI 4A or the second LSI 4B, is arranged adjacent to the optical element 4D, and the electronic component and the optical element 4D are formed in the same layer, thereby reducing the distance therebetween. Then, the electronic component and the optical element 4D are electrically connected to the wiring pattern 18. Therefore, in the hybrid module 1, an electrically connected portion has low parasitic capacitance, which makes it possible to process data signals or control signals in large quantities at high speed.

As described above, in the hybrid module 1, the mounted parts 4 are formed in the part mounting openings 8 of the silicon substrate 3 having a small thickness such that the input/output portion forming surfaces 10 are flush with each other and the input/output portion forming surfaces 10 are substantially flush with the first main surface 3A. In this way, the mounted parts 4 are embedded to be integrated with the silicon substrate 3. In the hybrid module 1, a plurality of mounted parts 4 having different sizes are provided, which makes it possible to reduce the thickness and size of a hybrid module and to achieve a multi-function and high-function hybrid module due to a high degree of integration.

In the hybrid module 1, the silicon substrate 3 that is hardly deformed due to, for example, heat is used as a base substrate, and the mounted parts 4 are integrated with the silicon substrate 3, which makes it possible to accurately mount the mounted parts 4 and to prevent the wiring lines from being broken between the wiring lines 5 and the silicon substrate 3. In the hybrid module 1, the silicon substrate 3 serves as the ground of the mounted parts 4 or the wiring layer 5 and also has a good heat dissipating function. Therefore, a hybrid module can be stably operated, which makes it possible to improve the reliability of the hybrid module.

In the hybrid module 1 having the above-mentioned structure, as shown in FIG. 2, the bumps 20 are bonded to the corresponding lands of a base wiring substrate 25, using the surface 5A of the wiring layer 5 as a mounting surface, so that they are mounted on the base substrate portion 7 together with other electronic parts 24, thereby forming the hybrid circuit device 2. As shown in FIG. 2, in the hybrid circuit device 2, two hybrid modules 1A and 1B are mounted on the base substrate portion 7, and the heat spreader 23 is bonded to the hybrid module 1A. However, one hybrid module or three or more hybrid modules may be mounted on the base substrate portion 7, and a plurality of electronic parts 24 may be mounted on the base substrate portion 7.

In the hybrid circuit device 2, the base substrate portion 7 is formed by mounting an optical waveguide member 26 to the base wiring substrate 25 formed by a known multi-layer wiring substrate technique. The base wiring substrate 25 is formed as follows: a multi-layer wiring pattern is formed by laminating a base composed of an organic substrate formed of, for example, glass epoxy or an inorganic substrate formed of, for example, ceramic, an insulating layer, and a base wiring layer; and the wiring patterns of the individual layers are connected to each other through vias. The base wiring substrate 25 is formed by, for example, a multi-layer wiring substrate technique for bonding two substrates by using, for example, prepreg.

In the base wiring substrate 25, although not described in detail, lands for mounting the hybrid modules 1A and 1B or the electronic parts 24 are formed on the uppermost wiring pattern and these mounted parts are electrically connected to one another by the wiring pattern layers. A power supply pattern that has a relatively large area and supplies power to the hybrid module 1 or a ground pattern is formed in the base wiring substrate 25, so that high-regulation power is supplied to the hybrid module 1.

In the hybrid circuit device 2, the optical element 4D, serving as a light emitting element, is provided in the first hybrid module 1A, and the optical element 4D, serving as a light receiving element, is provided in the second hybrid module 1B. In the hybrid circuit device 2, the electric signals are transmitted between the first hybrid module 1A and the second hybrid module 1B by the wiring pattern of the base wiring substrate 25, and the optical signal emitted from the optical element 4D of the second hybrid module 1B is input to the optical element 4D of the first hybrid module 1A. In the hybrid circuit device 2, a plurality of electrode pads are formed on the bottom surface of the base wiring substrate 25, and bumps are provided on these electrode pads. Then, the base wiring substrate 25 is mounted to, for example, a mother board (not shown).

An insulating protective layer 27 is formed on the main surface of the base wiring substrate 25 on which the hybrid module 1 is mounted. In the base wiring substrate 25, a plurality of lands are formed in a wiring pattern so as to face openings that are formed in the insulating protective layer 27 corresponding to the bumps 20 of the hybrid module 1. The hybrid module 1 is attached to the base wiring substrate 25 such that the bumps 20 are bonded to the corresponding lands through the openings. As described later, since the insulating protective layer 27 optically connects the optical element 4D of the hybrid module 1 to the optical waveguide member 26, it is formed of a light-transmitting insulating resin material.

In the base substrate portion 7, the optical waveguide members 26 are provided in the insulating layer of the base wiring substrate 25 so as to be laid across the hybrid modules 1A and 1B that are mounted adjacent to each other. As is generally known, the optical waveguide member 26 is formed by sealing a light guide member formed of a light-transmitting resin, such as epoxy-based resin, polyimide resin, acrylic-based resin, polyolefin-based resin, or rubber-based resin, with ground layers having different refractive indexes. The optical waveguide member 26 forms an optical-confinement-type waveguide that transmits optical signals in a two-dimensionally or three-dimensionally confined state.

Although not described in detail, both ends of the optical waveguide member 26 forming an incident portion and an emission portion are cut at an angle of 45° and the cut portions of the optical waveguide member 26 are formed of mirror surfaces. In this way, the optical waveguide member 26 changes the optical path of the optical signal traveling therein at an angle of 90°. Both ends of the optical waveguide member 26 are opposite to the optical signal transmitting paths 5B of the wiring layers 5 of the hybrid modules 1A and 1B, that is, the optical signal input/output portions 13 of the optical elements 4D, with the hybrid modules 1A and 1B mounted to the base substrate portion 7. Therefore, the optical signal emitted from the optical element (light emitting element) 4D of the hybrid module 1A is incident on one end of the optical waveguide member 26 and travels therethrough. Then, the optical signal is emitted from the other end of the optical waveguide member 26 and is incident on the optical element (light receiving element) 4D of the hybrid module 1B.

As described above, the hybrid circuit device 2 having the above-mentioned structure is formed by mounting to the base substrate portion 7 the hybrid module 1 that is a multi-function and high-performance module having small size and thickness and stably operates with high accuracy. Since the silicon substrate 3 is used as a base substrate in the hybrid module 1, the hybrid circuit device 2 is prevented from being deformed due to, for example, heat. Therefore, the breaking of wiring lines or the occurrence of cracks is prevented in the connection portions between the base substrate portion 7 and the hybrid module 1, which results in an improvement in reliability.

In the hybrid circuit device 2 including the hybrid modules 1A and 1B mounted to the base substrate portion 7, an electronic part, such as the first LSI 4A, the second LSI 4B, or the semiconductor device 4C, is electrically connected to the optical element 4D through the wiring layer 5 with high accuracy at a shortest distance, which makes it possible to reduce parasitic capacitance. In addition, the optical signals are transmitted in large quantities at high speed through the optical element 4D and the optical waveguide member 26 between the hybrid modules 1A and 1B.

Next, a process of manufacturing the hybrid module 1 having the above-mentioned structure will be described. The hybrid module 1 is manufactured through a silicon substrate manufacturing process, a mounted part integrating process, and a wiring layer forming process. In the silicon substrate manufacturing process, a predetermined process is performed on a silicon substrate 28 that is equivalent to a silicon wafer used in a general semiconductor manufacturing process to manufacture the silicon substrate 3. The silicon substrate manufacturing process includes a polishing process of polishing the silicon substrate 3 to a predetermined thickness, a part mounting opening forming process of forming the part mounting openings 8, and a conductive layer forming process of forming the conductive layer 16.

The mounted part integrating process is a process of providing the mounted parts 4 in the silicon substrate 3 such that the mounted parts 4 are integrated with the silicon substrate 3. In the mounted part integrating process, an intermediate 31 is manufactured through the following processes: a dummy substrate bonding process of bonding a dummy substrate 30 to the silicon substrate 3 with a peeling film 29 interposed therebetween; a part mounting process of mounting the mounted parts 4 in the part mounting openings 8; a sealing resin layer forming process of forming the sealing resin layer 9; a sealing resin layer polishing process of polishing the sealing resin layer 9 to a predetermined thickness; a heat dissipating plate bonding process of bonding the heat dissipating plate 6; and a dummy substrate peeling process of peeling off the dummy substrate 3. In the process of manufacturing the hybrid module 1, the hybrid module 1 is completed through a wiring layer forming process of forming the wiring layer 5 on the intermediate 31.

Figure 3:
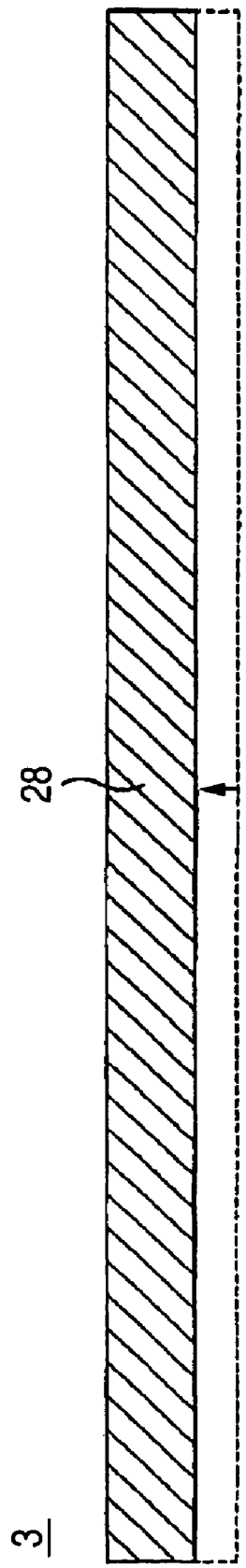
FIG. 3 is a diagram illustrating a process of manufacturing the hybrid module, and more specifically, is a cross-sectional view of a polished silicon substrate.

In the silicon substrate manufacturing process, since a general silicon substrate 28 is used as described above, the silicon substrate 28 having a relatively large thickness is polished by the polishing process to a thickness that is slightly larger than the height of the mounted part 4, thereby manufacturing the silicon substrate 3, as shown in FIG. 3. When the silicon substrate 3 having a predetermined thickness is used, the polishing process may not be performed.

In the silicon substrate manufacturing process, an etching process is performed on the silicon substrate 3 to collectively form a plurality of part mounting openings 8 in the part mounting opening forming process. The part mounting opening forming process includes a silicon etching film forming process of patterning a silicon etching film 32 on the second main surface 3B of the silicon substrate 3 and an etching process of etching the second main surface 3B. In the process of manufacturing the hybrid module 1, the conductive layer forming process is performed before the etching process to form the conductive layer 16 on the first main surface 3A of the silicon substrate 3.

In the silicon etching film forming process, a mask is put on portions of the second main surface 3B of the silicon substrate 3 corresponding to the part mounting openings 8, and a silicon etching film 32, such as a silicon dioxide ($SiO_2$) film or a silicon nitride (SixNy) film, is formed thereon. In the silicon etching film forming process, a silicon thermal oxidation process is performed on the silicon substrate 3 to form a silicon dioxide film, or a silicon dioxide film or a silicon nitride film is formed by a chemical vapor deposition method or a sputtering method.

Figure 4:
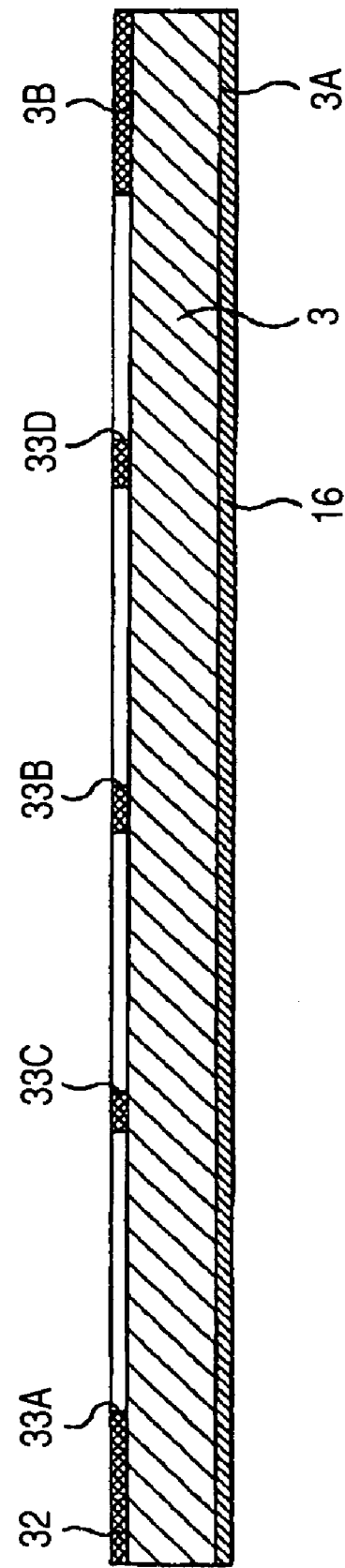
FIG. 4 is a cross-sectional view of the silicon substrate having a silicon etching film formed thereon.

In the silicon etching film forming process, the silicon etching film 32 having apertures 33A to 33D formed therein so as to correspond to the forming positions of the part mounting openings 8 is formed on the second main surface 3B of the silicon substrate 3 by the above-mentioned processes, as shown in FIG. 4. In the silicon etching film forming process, the silicon etching film 32 may be formed on the entire second main surface 3B of the silicon substrate 3, and portions of the silicon etching film 32 corresponding to the forming positions of the part mounting openings 8 may be removed, thereby forming the apertures 33. In the silicon etching film forming process, the silicon etching film 32 may be formed by a so-called patterning technique.

The conductive layer forming process is performed after or before the silicon etching film forming process to form the conductive film 16 on the entire main surface 3A of the silicon substrate 3. In the conductive layer forming process, a copper thin film having a predetermined thickness is formed on the entire main surface 3A by an appropriate method, such as a sputtering method or an electroless plating method. The conductive layer forming process forms the conductive layer 16 having an etching resistance characteristic that is not removed by an etching process, which will be described later, to be performed on the silicon substrate 3. When the conductive layer 16 does not have a sufficient etching resistance characteristic according to the content of the etching, the conductive layer forming process may be performed after the etching process. As described above, when the conductive layer 16 is not needed, it goes without saying that the conductive layer forming process is not performed.

Figure 5:
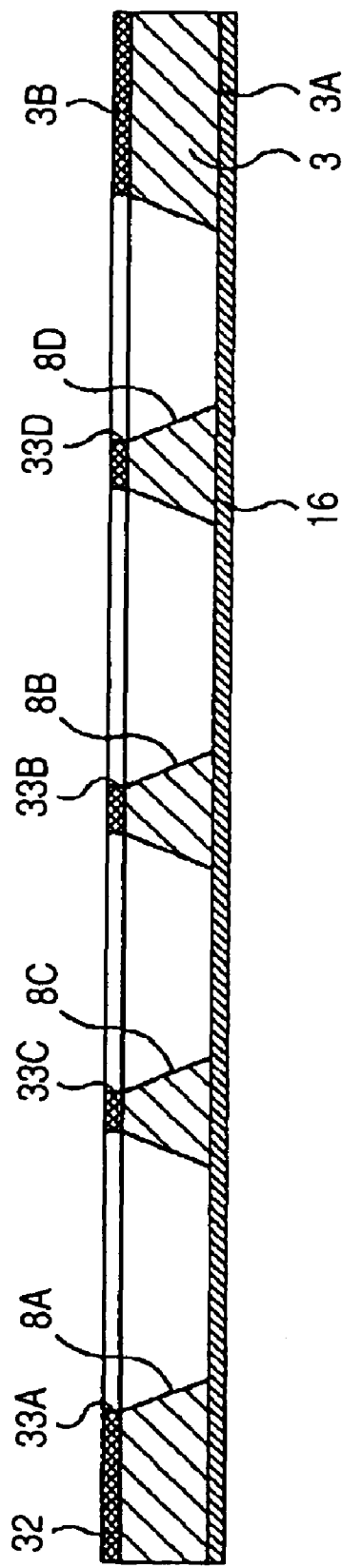
FIG. 5 is a cross-sectional view of the silicon substrate having part mounting openings formed therein and a conductive layer formed thereon.

In the etching process, portions of the silicon substrate 3 exposed from the apertures 33A to 33D of the silicon etching film 32 are etched until they reach the conductive film 16, thereby collectively forming a plurality of part mounting openings 8, as shown in FIG. 5. In the etching process, as described above, when a substrate having a surface orientation of 100 is used as the silicon substrate 28, an anisotropic etching process using an alkali etching solution, such as KOH or TMAH, is performed to form the part mounting openings having trapezoidal shapes in sectional view. In the etching process, when the silicon substrate 28 having a different orientation is used, isotropic etching may be performed, or dry etching may be performed to form the part mounting openings 8.

In the silicon substrate manufacturing process, the silicon etching film 32 remains on the second main surface 3B of the silicon substrate 3, but the silicon etching film 32 is removed by the polishing process, which will be described later. In the silicon substrate manufacturing process, the silicon etching film 32 may not be polished depending on the polishing conditions, but a silicon etching film removing process may be performed beforehand to remove the silicon etching film 32.

Figure 6:
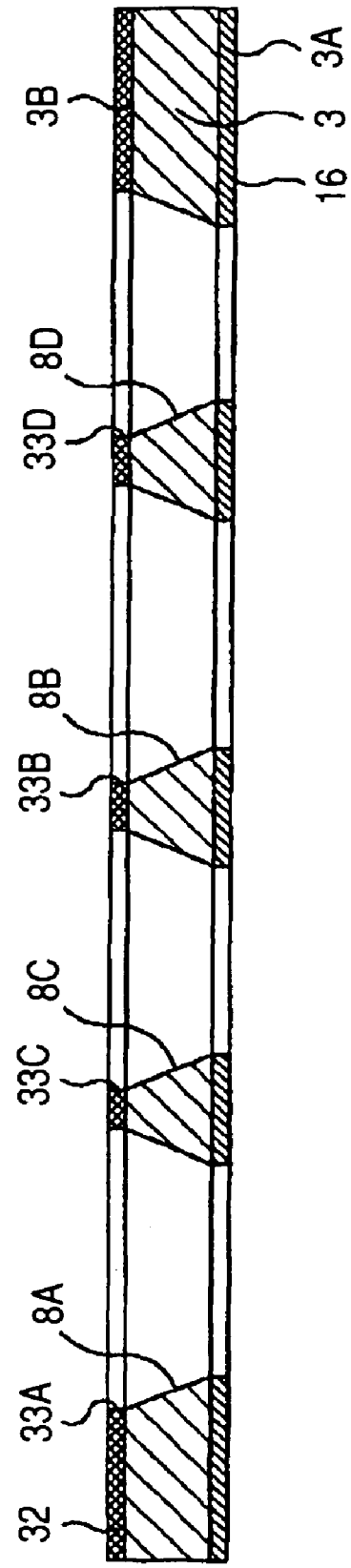
FIG. 6 is a cross-sectional view of the silicon substrate in which openings are formed in the conductive layer.

In the silicon substrate manufacturing process, as shown in FIG. 5, since the part mounting openings 8 are blocked by the conductive layer 16 formed on the first main surface 3A of the silicon substrate 3, a conductive layer manufacturing process for removing portions of the conductive layer 16 blocking the part mounting openings 8 is performed. In the conductive layer manufacturing process, portions of the conductive layer 16 are removed by an appropriate method, such as wet etching or dry etching, so that the part mounting openings 8 are formed in the first main surface 3A of the silicon substrate 3. In this way, the part mounting openings 8 passing through the silicon substrate 3 are formed, as shown in FIG. 6.

Figure 7:
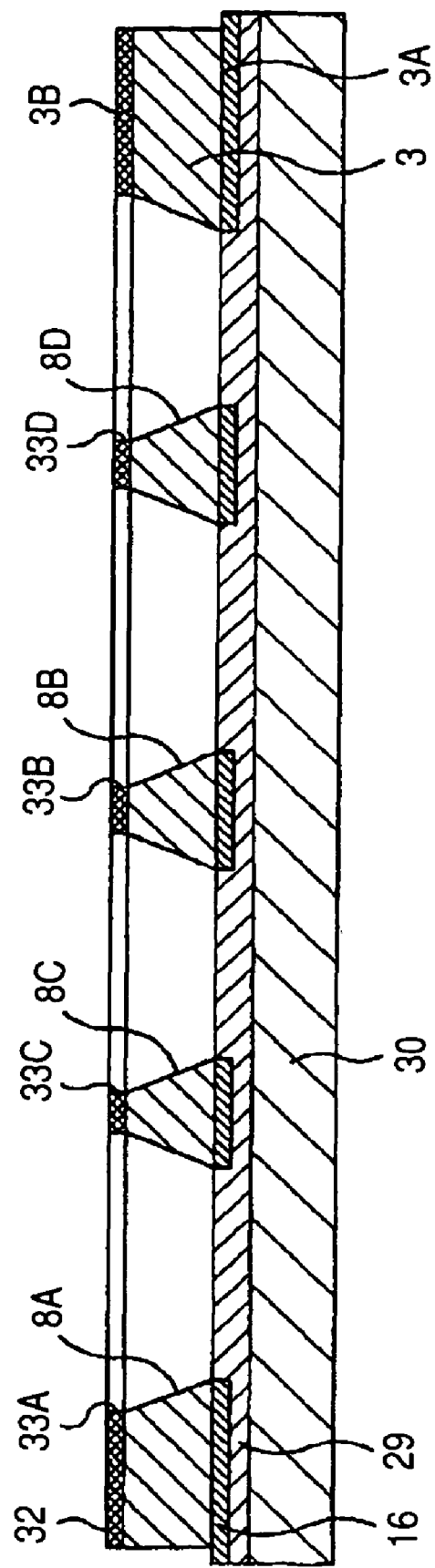
FIG. 7 is a cross-sectional view of a first intermediate having a dummy substrate bonded thereto.

In the mounted part integrating process, the mounted parts 4 are integrated with the silicon substrate 3 manufactured through the silicon substrate manufacturing process. In the dummy substrate bonding process of the mounted part integrating process, as shown in FIG. 7, the dummy substrate 30 is bonded to the silicon substrate 3 having the peeling film 29 attached thereto to manufacture a first intermediate 40. In the dummy substrate bonding process, the dummy substrate 30 that is composed of a thick glass substrate or silicon substrate having a relatively high mechanical rigidity, has a flat main surface, and has a size slightly larger than that of the silicon substrate 3 is used. In the dummy substrate bonding process, the peeling film 29 that can be peeled off from the silicon substrate 3 in a subsequent process is used. For example, any of the following peeling films can be used as the peeling film 29: a thermal peeling film whose adhesion is lowered by heating so that it can be peeled off; and a peeling film whose adhesion is lowered when it is dipped in a predetermined solution so that it can be peeled off.

In the first intermediate 40, the dummy substrate 30 is bonded to the first main surface 3A of the silicon substrate 3, particularly, on the conductive layer 16 with the peeling film 29 interposed therebetween, and thus the dummy substrate 30 serves as a reference surface of the mounted parts 4 provided in the part mounting openings 8. Since the dummy substrate 30 is bonded to the silicon substrate 3 having a small thickness, the overall mechanical rigidity of the first intermediate 40 is improved. In addition, the first intermediate 40 can be easily handled, and is prevented from being deformed in the subsequent process. In the first intermediate 40, the peeling film 29 bonds the silicon substrate 3 to the dummy substrate 30, and blocks the part mounting openings 8 so that it is bonded to the input/output portion forming surfaces 10 of the mounted parts 4 provided in the part mounting openings 8. Therefore, the peeling film 29 has a function of temporarily supporting the mounted parts 4.

Figure 8:
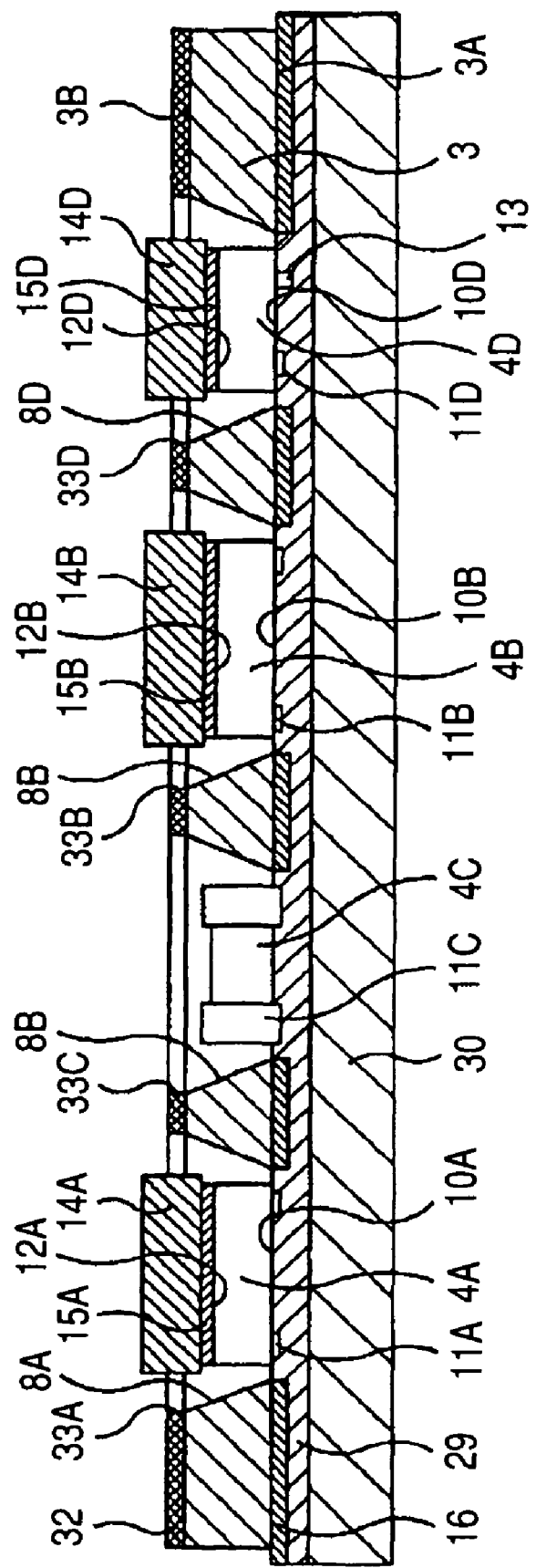
FIG. 8 is a cross-sectional view of a second intermediate in which mounted parts are mounted in the part mounting openings.

In the mounted part integrating process, the mounted parts 4 are mounted in the part mounting openings 8 from the second main surface 3B by the part mounting process, with the input/output portion forming surfaces 10 thereof used as mounting surfaces. In the part mounting process, the positioning of the mounted parts 4 with respect to the silicon substrate 3 is performed by an appropriate part mounting apparatus, and the mounted parts 4 are mounted in the part mounting openings 8. In the part mounting process, the input/output portion forming surfaces 10 of the mounted parts 4 come into contact with the main surface of the dummy substrate 30 (the peeling film 29). In this way, a second intermediate 41 in which the input/output portion forming surfaces 10 are positioned in the part mounting openings 8 so as to be flush with one another is manufactured, as shown in FIG. 8.

In the part mounting process, as described above, the mounted parts 4A, 4B, and 4D are mounted with the individual heat dissipating plates 14 bonded to the surfaces thereof by the insulating adhesives 15A, 15B, and 15D. The height of each of the mounted parts 4A, 4B, and 4D is substantially larger than the thickness of the silicon substrate 3, and the mounted parts 4 are mounted in the part mounting openings 8 with the individual heat dissipating plates 14 bonded thereto protruding from the second main surface 3B, as shown in FIG. 8. In the part mounting process, the mounted part 4C not requiring the heat dissipating is directly mounted in the part mounting opening 8.

In the sealing resin layer forming process of the mounted part integrating process, the sealing resin layer 9 is formed with a sufficient thickness to bury the individual heat dissipating plates 14 protruding from the second main surface 3B of the silicon substrate 3. In the sealing resin layer forming process, the sealing resin layer 9 is formed of an insulating sealing resin that is generally used in, for example, a semiconductor manufacturing process, such as a thermosetting liquid epoxy-based resin or liquid polyimide resin. In the sealing resin layer forming process, for example, the silicon substrate 3 is put in a cavity, such as a mold, and a sealing resin is filled in the cavity to flow into the circumferential portions of the mounted parts 4 provided in the part mounting openings 8.

Figure 9:
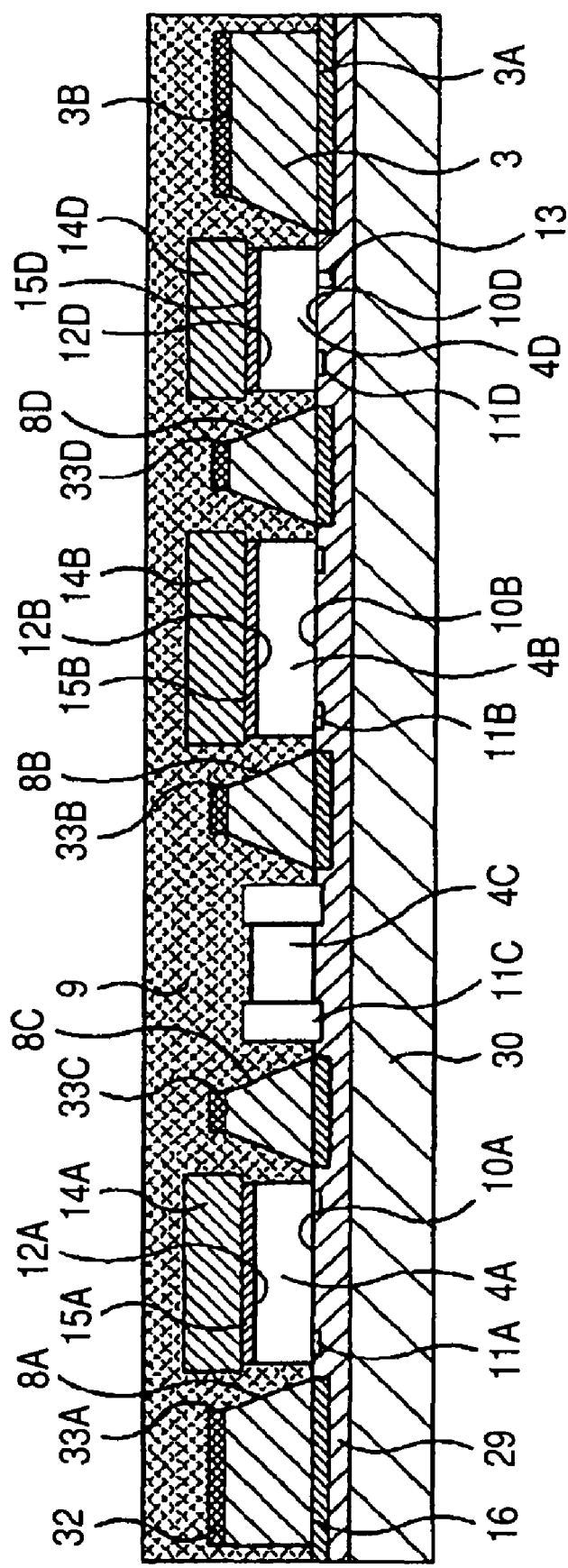
FIG. 9 is a cross-sectional view of a third intermediate having a sealing resin layer formed therein.

In the sealing resin layer forming process, a hardening process, such as a process of heating a mold, is performed to harden the insulating sealing resin, thereby manufacturing a third intermediate 42 in which the silicon substrate 3 and the mounted parts 4 are buried in the sealing resin layer 9 on the dummy substrate 30, as shown in FIG. 9. In the third intermediate 42, a sealing resin material forming the sealing resin layer 9 is filled into the part mounting openings 8 to bury the mounted parts 4, and is then hardened. In this way, the mounted parts 4 are integrated with the silicon substrate 3. In the third intermediate 42, specifically, since the input/output pads 11 protrude toward the dummy substrate 30 and come into contact with the dummy substrate 30, the insulating sealing resin flows into a gap between the main surface of the dummy substrate 30 and the input/output portion forming surfaces 10 of the mounted parts 4 to form the sealing resin layer 9 in the gap. Therefore, a coating film is also formed on the input/output portion forming surfaces 10. In the third intermediate 42, the input/output portion forming surfaces 10 of the mounted parts 4 are protected by the coating film.

Since the sealing resin layer 9 having a sufficient thickness is formed in the third intermediate 42, it is possible to prevent the mounted parts 4 from being damaged in the subsequent sealing resin layer polishing process, or it is possible to prevent the mounted parts 4 from being peeled off from the sealing resin layer 9 due to an excessively large load directly applied to the mounted parts 4. It is preferable that the sealing resin layer 9 be formed with a sufficient thickness to cover the mounted parts 4 formed in the part mounting openings 8. In the sealing resin layer forming process, the sealing resin layer 9 may be formed by an appropriate resin package forming method used in various kinds of chip manufacturing processes.

Figure 10:
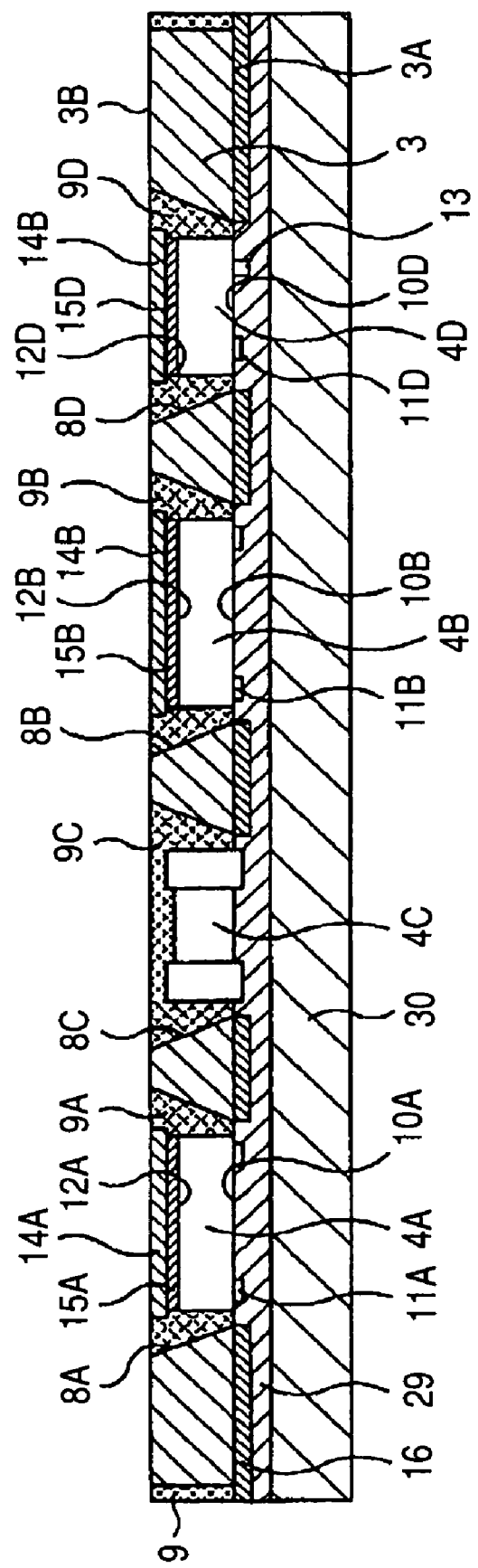
FIG. 10 is a cross-sectional view of a fourth intermediate in which the sealing resin layer is polished.

In the sealing resin layer polishing process of the mounted part integrating process, polishing is performed on the sealing resin layer 9 until the second main surface 3B of the silicon substrate 3 is exposed, thereby forming a fourth intermediate 43 having a small thickness, as shown in FIG. 10. That is, in the sealing resin layer polishing process, the sealing resin layer 9 is polished from the main surface of the third intermediate 42 to the silicon substrate 3 by, for example, a mechanical/chemical polishing method. In the sealing resin layer polishing process, as described above, since polishing is performed on the sealing resin layer 9 having a relatively high mechanical rigidity due to the dummy substrate 30 bonded thereto, the polishing can be performed accurately and effectively.

In the sealing resin layer polishing process, as described above, the individual heat dissipating plates 14 bonded to the bottom surfaces 12 of the mounted parts 4 protrude from the second main surface 3B of the silicon substrate 3, and the individual heat dissipating plates 14 are simultaneously polished with the sealing resin layer 9 until they are flush with the second main surface 3B, as shown in FIG. 10, thereby reducing the thicknesses of the individual heat dissipating plates 14. In the sealing resin layer polishing process, the silicon etching film 32 remaining on the second main surface 3B of the silicon substrate 3 is also polished to be removed at the same time. Further, since the sealing resin layer polishing process is performed to thin down the hybrid module 1 and to improve heat dissipating characteristics of the hybrid module 1, polishing may be performed on the sealing resin layer 9 until the individual heat dissipating plates 14 bonded to the mounted parts 4 are at least exposed.

Figure 11:
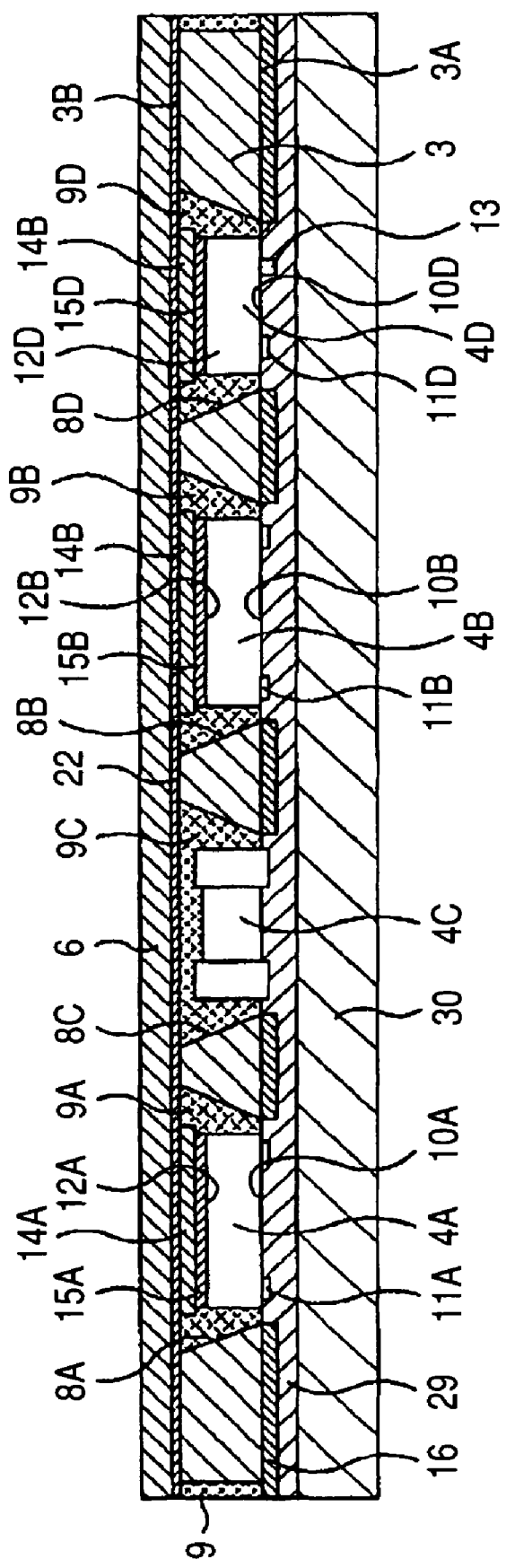
FIG. 11 is a cross-sectional view of a fifth intermediate having a heat dissipating plate bonded thereto.

In the mounted part integrating process, the heat dissipating plate 6 formed of, for example, a copper plate is bonded to the entire second main surface 3B of the silicon substrate 3 through the adhesive layer 22 by the heat dissipating plate bonding process, thereby manufacturing a fifth intermediate 44, as shown in FIG. 11. In the fifth intermediate 44, the heat dissipating plate 6 is bonded to the second main surface 3B that is planarized by the sealing resin layer polishing process, so that it is closely adhered to the entire surfaces of the individual heat dissipating plates 14 bonded to the mounted parts 4, which results in high thermal conductivity.

The fifth intermediate 44 can be easily handled in the subsequent process since the mechanical strength thereof is improved by bonding the heat dissipating plate 6 to the fourth intermediate 43 having a small thickness. In the fifth intermediate 44, the heat dissipating plate 6 prevents the detachment or positional deviation of the mounted parts 4 that are fixed in the part mounting openings 8 having trapezoidal shapes in sectional view in which surfaces facing the second main surface 3B have larger diameters by the sealing resin layer 9. In the fifth intermediate 44, the mounted parts 4 and the sealing resin layer 9 are reliably held in the part mounting openings 8 by the heat dissipating plate 6.

Figure 12:
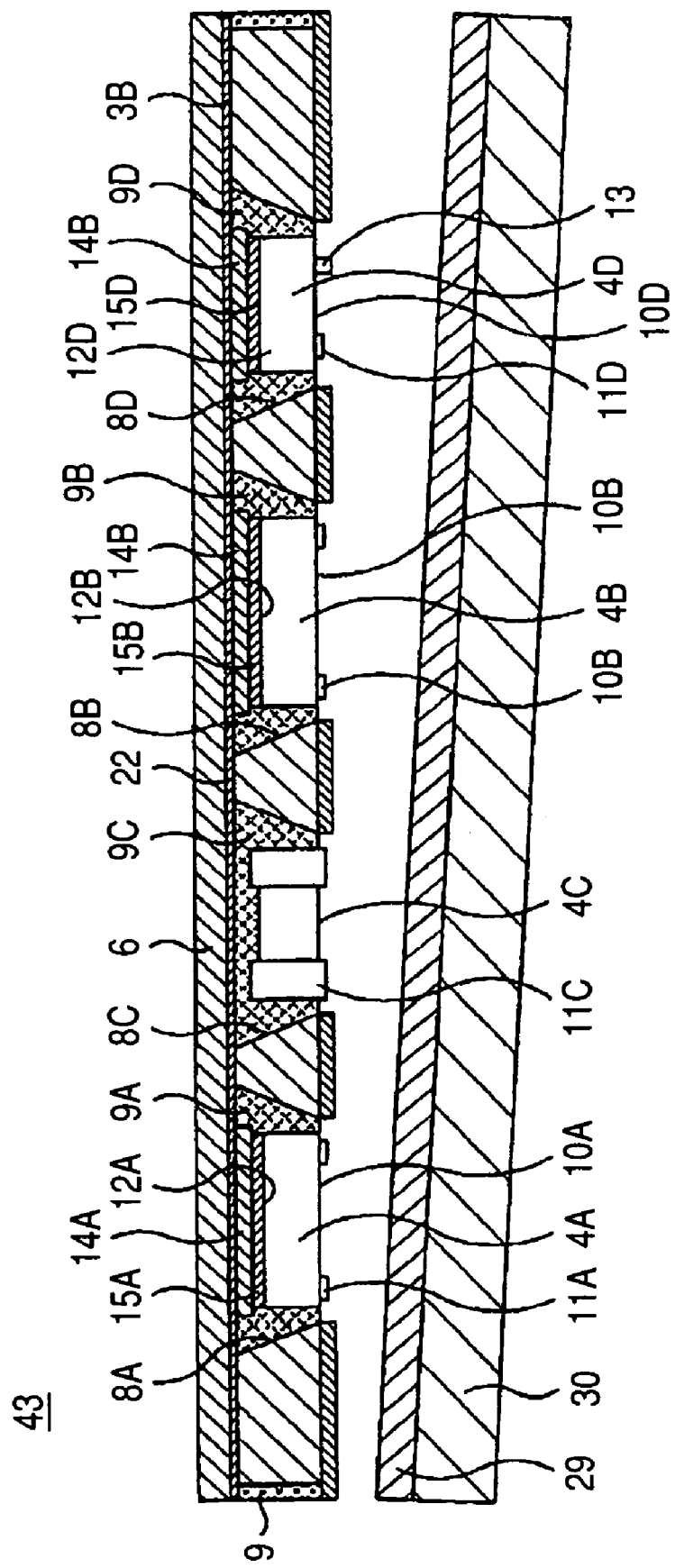
FIG. 12 is a diagram illustrating a process of peeling the dummy substrate from the silicon substrate.

In the mounted part integrating process, as shown in FIG. 12, the dummy substrate 30 that is bonded to the thin silicon substrate 3 to reinforce the mechanical rigidity of the silicon substrate 3 and thus to improve the handling thereof is peeled off from the fourth intermediate 43 by the dummy substrate peeling process. In the dummy substrate peeling process, as described above, when heat is applied to the fourth intermediate 43, the dummy substrate 30 bonded to the first main surface 3A of the silicon substrate 3 through the peeling film 29 of a thermal peeling type is peeled off from the silicon substrate 3 together with the peeling film 29, thereby manufacturing the intermediate 31 shown in FIG. 13.

Figure 13:
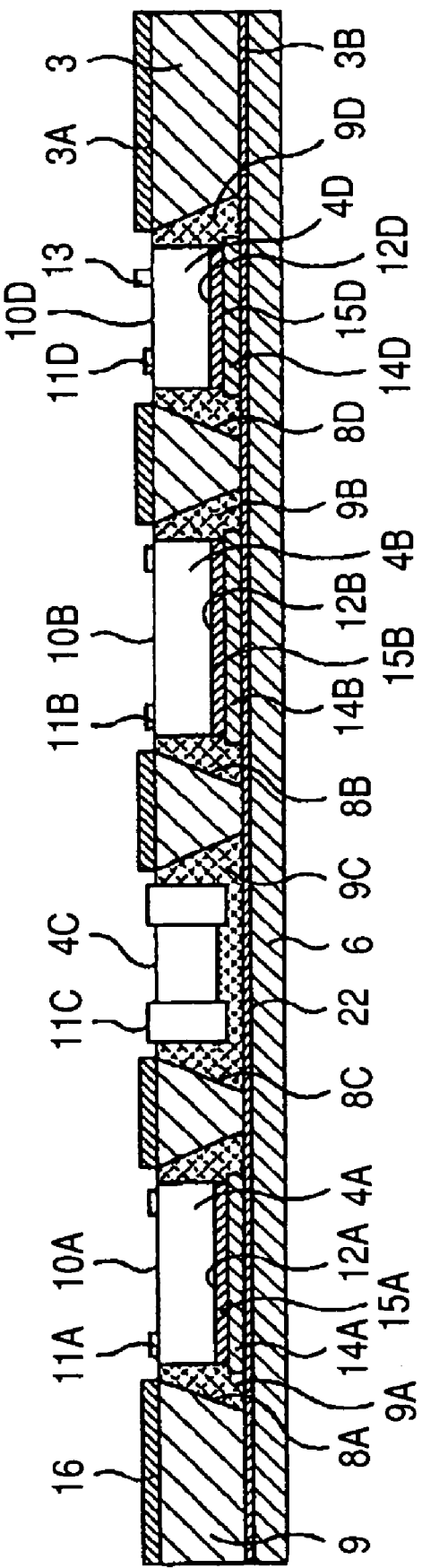
FIG. 13 is a cross-sectional view of an intermediate from which the dummy substrate has been peeled.

The intermediate 31 has a high mechanical rigidity after the dummy substrate 30 is peeled off since the heat dissipating plate 6 has been bonded to the second main surface 3B of the silicon substrate 3 by the previous heat dissipating plate bonding process. As shown in FIG. 13, in the intermediate 31, the mounted parts 4 are buried in the part mounting openings 8 by the sealing resin layer 9 such that the input/output portion forming surfaces 10 of the mounted parts 4 are flush with the first main surface 3A of the silicon substrate 3. In this way, the mounted parts 4 are integrate with the silicon substrate 3. In the intermediate 31, the peeling-off of the dummy substrate 30 causes the input/output pads 11 provided on the input/output portion forming surfaces 10 of the mounted parts 4 and the optical signal input/output portion 13 of the optical element 4D to be exposed, and the conductive layer 16 is formed on the first main surface 3A of the silicon substrate 3 having the part mounting openings 8 formed therein.

Figure 14:
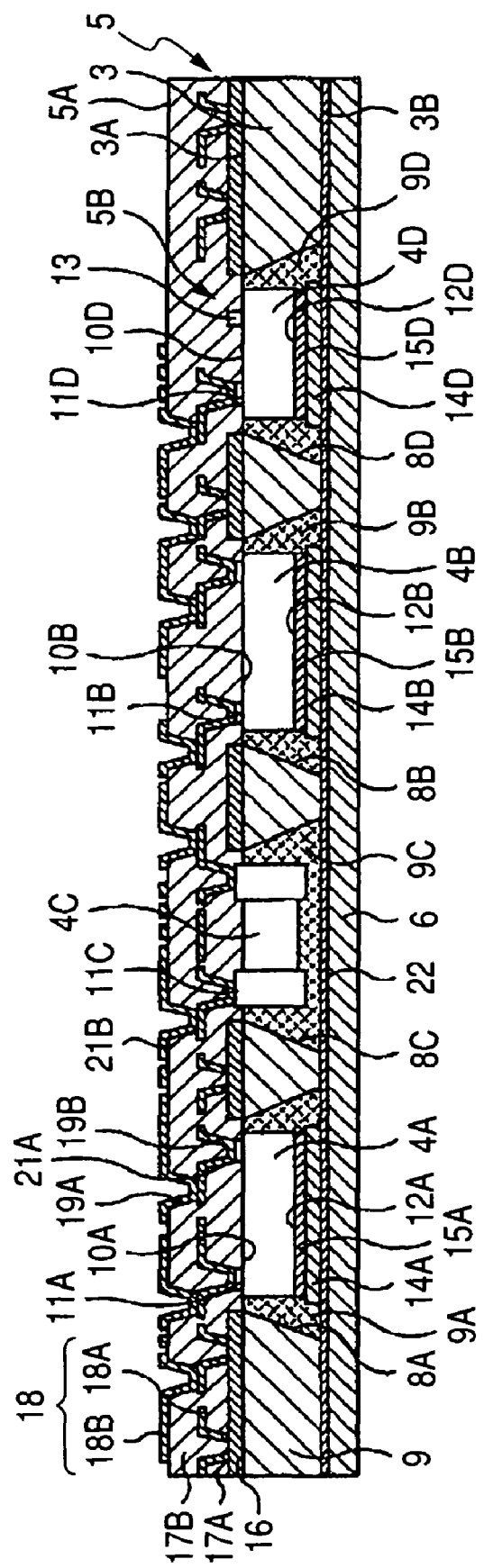
FIG. 14 is a cross-sectional view of an intermediate module obtained by forming a wiring layer on the intermediate.

The wiring layer forming process using a general multilayer wiring technique is performed on the intermediate 31 to form the wiring layer 5 on the first main surface 3A of the silicon substrate 3, as shown in FIG. 14. More specifically, the wiring layer forming process includes a first insulating resin layer forming process of forming the first insulating resin layer 17A on the first main surface 3A, a first via hole forming process of forming a plurality of first via holes 21A in the first insulating resin layer 17A, a first wiring pattern forming process of forming the first wiring pattern 18A on the first insulating resin layer 17A, and a first via forming process of performing a conductive treatment on the first via holes 21A to form the first vias 19A.

The wiring layer forming process further includes a second insulating forming process of coating the first wiring pattern 18A on the first insulating resin layer 17A to form the second insulating layer 17B, a second via hole forming process of forming a plurality of second via holes 21B in the second insulating layer 17B, a second wiring pattern forming process of forming the second wiring pattern 18B on the second insulating layer 17B, and a second via forming process of performing a conductive treatment on the second via holes 21B to form the second vias 19B. An intermediate hybrid module 45 shown in FIG. 14 is manufactured through the above-mentioned processes. In the wiring layer forming process, a plurality of wiring layers 5 may be formed by repeatedly performing the above-mentioned processes.

In the wiring layer forming process, the first insulating resin layer 17A and the second insulating layer 17B are formed of a light-transmitting insulating resin having photosensitivity, such as epoxy-based resin. In the first insulating resin layer forming process, an insulating resin is applied onto the first main surface 3A of the silicon substrate 3 with a uniform thickness by a spin coating method or a dip method, and a heat process is performed thereon to harden the insulating resin, thereby forming the first insulating resin layer 17A. In the first via hole forming process, a predetermined masking process, an exposing process, and a developing process are sequentially performed on the first insulating resin layer 17A, and the insulating resin is removed by etching, thereby forming the first via holes 21A through which the conductive layer 16 and the input/output pads 11 of the mounted parts 4 are exposed to the outside. In the first via hole forming process, when the first insulating resin layer 17A is formed of a non-photosensitive insulating resin, the first via holes 21A are formed by dry etching, such as laser radiation.

In the wiring layer forming process, the first via forming process is performed on the first via holes 21A formed by the first via hole forming process to form the first vias 19A. In the first via forming process, a desmear process and an electroless copper plating process are performed on the first via holes 21A to make the inner walls of the first via holes 21A conductive. In the first via forming process, a conductive paste is filled into the first via holes 21A, and a cover forming process is performed, thereby forming the first vias 19A.

In the first wiring pattern forming process, although not described in detail, the first insulating resin layer 17A is patterned by using a plating resist, and, for example, an electroless copper plating process is performed thereon to form a copper plating layer having a predetermined thickness. Then, an unnecessary plating resist is removed to form the first wiring pattern 18A composed of a predetermined copper wiring pattern. In the first wiring pattern forming process, as described above, an appropriate patterning design is performed on the first insulating resin layer 17A such that the first wiring pattern 18A and the first via 19 are not formed on the optical signal transmitting path 5B through which the optical signal from the optical signal input/output portion 13 of the optical element 4D travels.

The second insulating resin layer forming process is the same as the first insulating resin layer forming process. In the second insulating resin layer forming process, the second insulating resin layer 17B is formed with a uniform thickness on the entire surface of the first insulating resin layer 17A having the first wiring pattern 18A formed thereon. Also, the second insulating resin layer forming process uses the same insulating resin material as that forming the first insulating resin layer 17A. The insulating resin is applied onto the first insulating resin layer 17A with a uniform thickness by, for example, a spin coating method, and is then hardened by heating, thereby forming the second insulating resin layer 17B.

In the wiring layer forming process, the second via holes 21B through which the lands formed on the first wiring pattern 18A are exposed to the outside are formed in the second insulating resin layer 17B by the second via hole forming process that is the same as the first via hole forming process. In the wiring layer forming process, the second wiring pattern 18B is formed on the second insulating resin layer 17B by the second wiring pattern forming process that is the same as the first wiring pattern forming process. The second wiring pattern 18B is connected to the first wiring pattern 18A through the second via holes 21B, and lands for connection to the base substrate portion, which is not described in detail, are formed in the second wiring pattern 18B.

In the wiring layer forming process, a bump forming process of forming the bumps 20 on the lands of the second wiring pattern 18B is performed to form a plurality of bumps 20 on the surface 5A of the wiring layer 5, thereby completing the hybrid module 1 shown in FIG. 1. In the bump forming process, the bumps 20 having a predetermined height are formed on the lands by, for example, a gold plating process. As described above, the bump forming process may be a process of providing, for example, solder balls or metal balls on the lands by a method of mounting the hybrid module 1 to the base substrate portion 7.

In the hybrid module manufacturing process, as described above, a plurality of mounted parts 4 having different outward appearances are provided, but the hybrid module is mounted to the base substrate portion with the mounted parts 4 buried in the silicon substrate 3. Therefore, it is possible to manufacture the hybrid module 1 that has small size and thickness, and is capable of reducing parasitic capacitance since the mounted parts 4 and the wiring layer 5 are connected to each other at a shortest distance, and thus of improving characteristics thereof. In the hybrid module manufacturing process, the wiring layer 5 having a multi-layer structure is formed on the first main surface 3A of the flat silicon substrate 3, and the wiring layer 5 is formed by a so-called wafer process performed in a semiconductor manufacturing process, which makes it possible to accurately and minutely form the wiring pattern 18 on the insulating layer 17. Thus, it is possible to manufacture the hybrid module 1 having small size and thickness, and a plurality of functions.

In the hybrid module manufacturing process, the silicon substrate 3 that is hardly deformed due to heat is used as a base substrate, and the mounted parts 4 provided in the part mounting openings 8 formed in the silicon substrate 3 is covered with the sealing resin layer 9, thereby manufacturing the hybrid module 1. In the hybrid module manufacturing process, the deformation of the silicon substrate 3 due to heat is prevented in the etching process or a reflow soldering process of mounting the hybrid module 1 to the base substrate portion 7, and thus the mounted parts 4 are accurately positioned in the silicon substrate 3. Therefore, the mounted parts 4 are reliably connected to the wiring layer 5, and thus the breaking of wiring lines is prevented, which makes it possible to manufacture the hybrid module 1 having high reliability.

In the hybrid module manufacturing process, the silicon substrate 3 serves as the ground of the mounted parts 4 or the wiring layer 5 and has a function of effectively dissipating heat, which makes it possible to manufacture the hybrid module 1 that can be stably operated. Further, in the hybrid module manufacturing method, the individual heat dissipating plates 14 are bonded to the necessary mounted parts 4, and the heat dissipating plate 6 having a large size is also provided, which makes it possible to manufacture the hybrid module 1 having a good heat dissipating characteristic.

The hybrid module 1 manufactured through the above-mentioned processes is mounted on the base substrate portion 7 together with other electronic parts 24 through the bumps 20 by a mounting method, such as a flip chip mounting method, in the hybrid module mounting process, thereby completing the hybrid circuit device 2 shown in FIG. 2. In the hybrid module mounting process, as described above, the two hybrid modules 1A and 1B are mounted on the base substrate portion 7, thereby completing the hybrid circuit device 2. However, one hybrid module or three or more hybrid modules and a plurality of electronic parts 24 may be mounted on the base substrate portion 7.

In the hybrid module mounting process, the hybrid module 1 is mounted to the base substrate portion 7 together with the electronic parts 24, using the surface 5A of the wiring layer 5 as a mounting surface. In the hybrid module mounting process, an ultrasonic welding process is performed on the hybrid module 1, with the bumps 20 thereof aligned with the corresponding lands of the base substrate portion 7, thereby mounting the hybrid module 1 to the base substrate portion 7.

In the base substrate portion 7, the optical waveguide member 26 is mounted on the base wiring substrate 25 manufactured by a known multi-layer wiring substrate technique, and the lands for electrically connecting and fixing the hybrid module 1 and the electronic part 24 are formed on the uppermost wiring pattern. The insulating protective layer 27 and the optical waveguide member 26 are provided in the base substrate portion 7, and the hybrid module 1 is mounted to the base substrate portion 7 with the optical element 4D aligned with the incident/emission end of the optical waveguide member 26. In the hybrid circuit device 2, the heat spreader 23 is bonded to the heat dissipating plate 6 of the hybrid module 1.

The hybrid circuit device 2 formed by mounting the hybrid module 1 to the base substrate portion 7 through the above-mentioned processes is mounted to, for example, a mother board through electrode pads formed on the bottom surface of the base wiring substrate 25. In the hybrid circuit device 2, the bumps 20 are formed in the hybrid module 1, but they may be formed in the base substrate portion 7. The bumps 20 are formed by an appropriate method. For example, copper bumps are formed by a copper plating method, and nickel-gold plating or solder plating is performed on the copper bumps, thereby forming the bumps 20. A so-called rigid multi-layer wiring substrate is used as the base substrate portion 7. However, for example, a flexible wiring substrate using a polyimide film may be used as the base substrate portion 7.

In the above-described embodiment, the hybrid module 1 and the hybrid circuit device 2 have the optical element 4D mounted in the silicon substrate 3 as the mounted part 4, and have an electric signal processing function of transmitting/receiving electrical control signals or data signals or supplying power and an optical signal processing function of transmitting/receiving optical control signals or data signals.

However, the invention is not limited thereto. For example, the hybrid module and the hybrid circuit device may have only the electric signal processing function. In the hybrid module and the hybrid circuit device, it is unnecessary that the insulating layer be formed of a light-transmitting insulating resin material.

Figure 15:
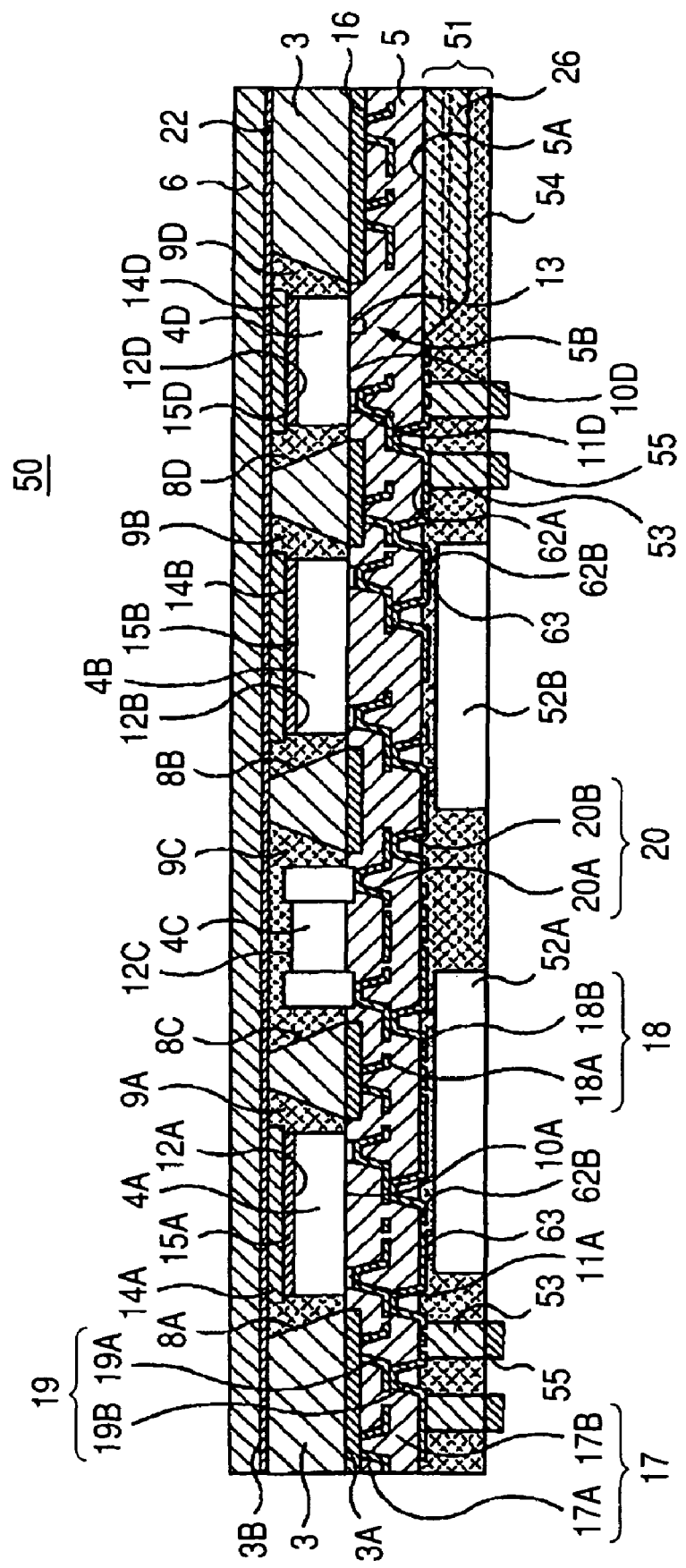
FIG. 15 is a cross-sectional view of a hybrid module according to a second embodiment of the invention.

In the above-described embodiment, in the hybrid module 1, the wiring layer 5 is formed on the first main surface 3A of the silicon substrate 3 having the mounted parts 4 provided therein, but the invention is not limited thereto. For example, according to a second embodiment, as in a hybrid module 50 shown in FIG. 15, a second part mounting layer 51 having second mounted parts 52, such as a third LSI 52A and a fourth LSI 52B, formed therein may be laminated on the wiring layer 5.

The hybrid module 50 is substantially similar to the hybrid module 1 except for the structure of the second part mounting layer 51. Therefore, in the hybrid module 50, the same components as those in the hybrid module 1 have the same reference numerals, and thus a description thereof will be omitted. In the hybrid module 50, the third LSI 52A and the fourth LSI 52B are mounted on the wiring layer 5 as the second mounted parts 52. However, a plurality of LSIs may be mounted, or a semiconductor device or electronic parts other than the semiconductor device may be mounted in addition to the LSIs.

In the hybrid module 50, as described above, a plurality of connection pads 62 are formed in portions of the second wiring pattern 18B formed on the surface (uppermost layer) 5A of the wiring layer 5. The second mounted parts 52 are mounted on the connection pads 62 by, for example, a flip chip mounting method, and a plurality of external connection columns 53 are formed on the second wiring pattern 18B. Further, in the hybrid module 50, the optical waveguide member 26 is mounted to the surface 5A of the wiring layer 5 such that one end forming a mirror surface is opposite to the optical signal transmitting path 5B.

In the hybrid module 50, the second sealing layer 54 is formed on the surface 5A of the wiring layer 5. Similar to the sealing resin layer 9, the second sealing layer 54 is formed of an insulating sealing resin, such as a thermosetting liquid epoxy-based resin or a liquid polyimide resin, on the wiring layer 5 with a sufficient thickness to bury the second mounted parts 52, the external connection columns 53, and the optical waveguide member 26. The second sealing layer 54 fixes the mounted parts to the wiring layer 5 by hardening the insulating resin.

In the hybrid module 50, after the second sealing layer 54 is hardened on the wiring layer 5, it is polished to a predetermined thickness. In the hybrid module 50, when the second sealing layer 54 is polished, the third LSI 52A or the fourth LSI 52B is thinned down by polishing a so-called back surface in the range in which the function thereof is not damaged. Further, in the hybrid module 50, the polishing of the second sealing layer 54 causes the upper end surfaces of the external connection columns 53 to be flush with the surface of the second sealing layer 54 and the polishing surfaces of the second mounted parts 52 and to be exposed to the outside. In addition, bumps 55 are formed on the exposed upper end surfaces of the external connection columns 53 by gold plating, tin plating, or solder plating.

In the hybrid module 50, as described above, a plurality of mounted parts 4 having different characteristics are mounted in the silicon substrate 3, and the second mounted parts 52 are also mounted on the surface 5A of the wiring layer 5 formed on the first main surface 3A of the silicon substrate 3. The thickness of the hybrid module 50 is slightly larger than that of the hybrid module 1 by a value corresponding to the thickness of the second mounted parts 52, but a multi-function and high-performance hybrid module is obtained. Since the parts are mounted in the hybrid module 50 at high density, the overall thickness and size of the hybrid module 50 are reduced.

In the hybrid module 50, the silicon substrate 3 that is hardly deformed due to, for example, heat is used as a base substrate, and the mounted parts 4 are integrated with the silicon substrate 3. Then, the wiring layer 5 is accurately formed on the silicon substrate 3, and the second mounted parts 52 are mounted on the wiring layer 5. In the hybrid module 50, the silicon substrate 3 serves as the ground of the mounted parts 4, the wiring layer 5, or the second mounted parts 52 and has a good heat dissipating characteristic. Therefore, the hybrid module 50 can be stably operated, which makes it possible to improve the reliability thereof. In the hybrid module 50, since the mounted parts 4 or the second mounted parts 52 are directly connected to the wiring layer 5 by the vias 19, the length of wiring lines is shortened, and the capacitance of connection portions therebetween is reduced. In addition, delay in the transmission of signal due to a CR time constant, EMI noise, or EMC is reduced. As a result, the characteristics of the hybrid module are improved.

Figure 16:
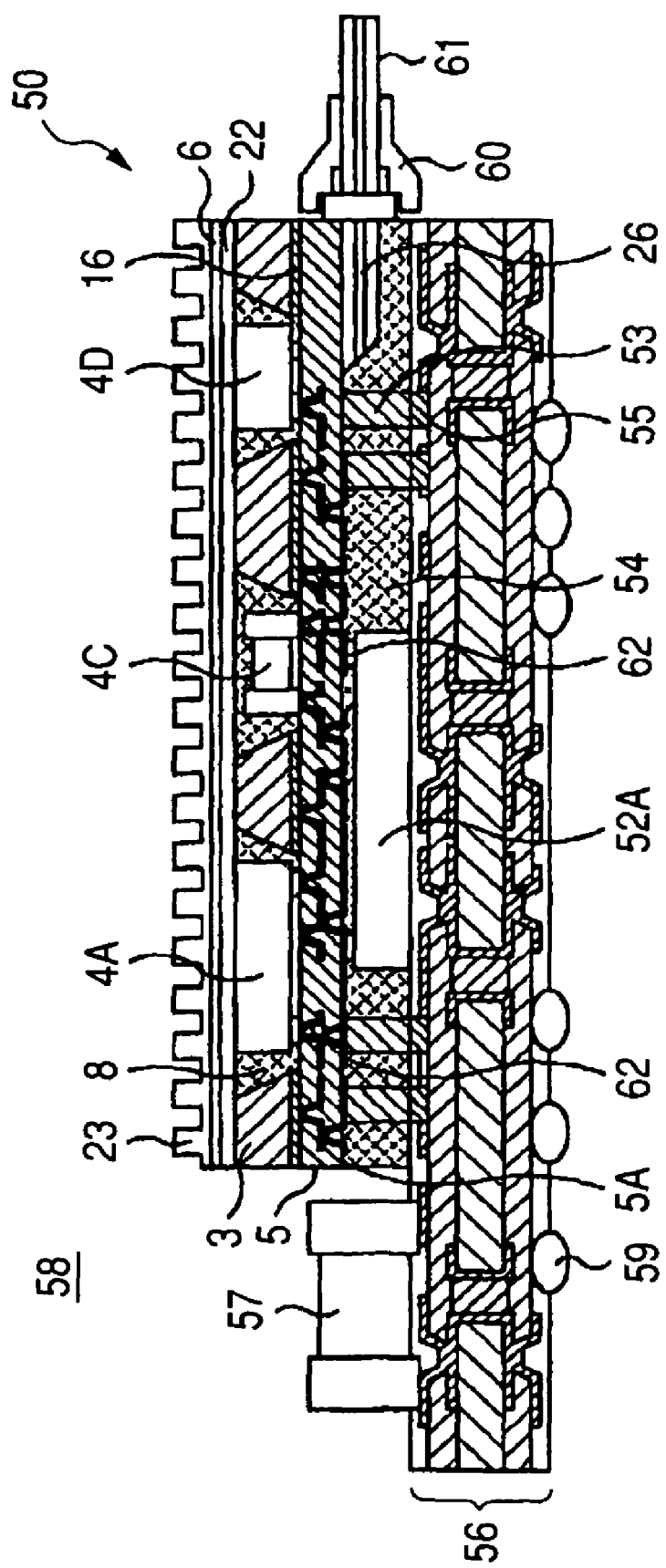
FIG. 16 is a cross-sectional view of a hybrid circuit device provided with the hybrid module.
Figure 17:
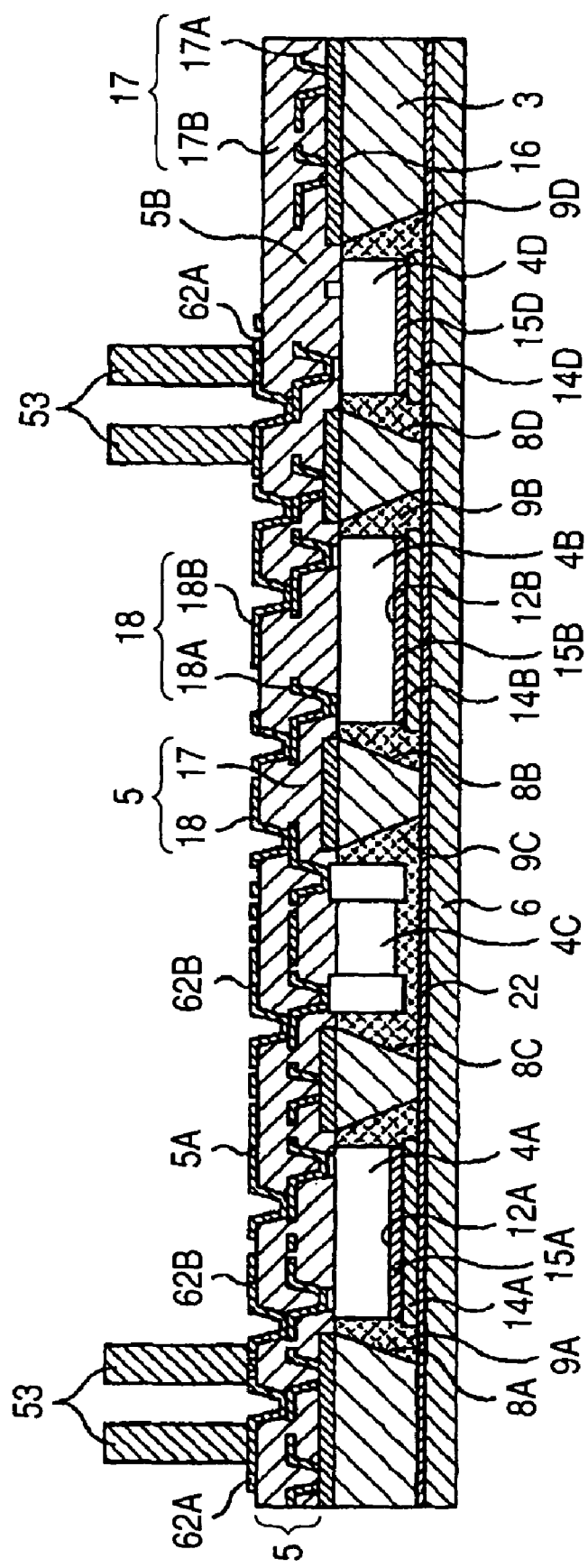
FIG. 17 is a cross-sectional view of an intermediate in which external connection columns are formed on a wiring layer.

As shown in FIG. 16, although not described in detail, the hybrid module 50 having the above-mentioned structure is mounted to a wiring substrate 56, such as a mother board or an interposer, together with an external electronic part 57 by a flip chip mounting method, thereby forming a hybrid circuit device 58. For the purpose of simplicity of explanation, only the third LSI 52A is mounted in the hybrid module 50. The hybrid circuit device 58 has the hybrid module 50 mounted therein, and includes an electric wiring structure for transmitting/receiving electric control signals or data signals or supplying power and an optical wiring structure for transmitting/receiving optical control signals or data signals, similar to the hybrid circuit device 2. Therefore, the hybrid circuit device 58 can process the control signals or the data signals in large quantities at high speed.

The hybrid circuit device 58 is mounted to, for example, a control substrate of an apparatus (not shown) through connection bumps 59 provided on the bottom surface of the wiring substrate 56 in a flip chip manner, thereby forming, for example, a high-frequency optical front end module. As described above, in the hybrid circuit device 58, an optical connector member 60 is connected to an end of the optical waveguide member 26 mounted in the second part mounting layer 51 of the hybrid module 50.

In the hybrid circuit device 58, an optical signal that is emitted from the optical element 4D of the hybrid module 50 and then travels along the optical signal transmitting path 5B of the wiring layer 5 is incident on one end of the optical waveguide member 26. In the hybrid circuit device 58, the optical signal is transmitted to the optical connector member 60 by the mirror surface of the optical waveguide member 26, and is then emitted to, for example, a control unit (not shown) through an optical fiber 61 connected to the optical connector member 60. In the hybrid circuit device 58, when the optical element 4D of the hybrid module 50 is a light receiving element, the optical signal that is emitted from the control unit and is then transmitted to the optical connector member 60 through the optical fiber 61 is incident into the optical signal transmitting path 5B of the wiring layer 5 by the mirror surface of the optical waveguide member 26. In the hybrid circuit device 58, the optical signal travels along the optical signal transmitting path 5B and is then incident on the optical element 4D.

The process of manufacturing the hybrid module 50 has been described above. However, the processes up to the wiring layer forming process in the process of manufacturing the hybrid module 50 are the same as those in the process of manufacturing the hybrid module 1, and thus a description thereof will be omitted. The process of manufacturing the hybrid module 50 includes a connection pad forming process of forming a plurality of connection pads 62 on the surface 5A of the wiring layer 5, an external connection column forming process of forming a plurality of external connection columns 53 through the connection pads 62, a second part mounting process of forming the second part forming layer 51 having a plurality of second mounted parts 52 mounted therein, and an optical waveguide member mounting process of mounting the optical waveguide member 26. The process of manufacturing the hybrid module 50 further includes a second sealing layer forming process of forming the second sealing layer 54 on the surface 5A of the wiring layer 5, a second sealing layer polishing process of polishing the second sealing layer 54 to a predetermined thickness, and a connection bump forming process of forming a plurality of connection bumps 59.

In the process of manufacturing the hybrid module 50, as described in the process of manufacturing the hybrid module 1, the second wiring pattern 18B is formed by the wiring layer forming process, and a plurality of connection pads 62 are integrally formed at appropriate positions of the second wiring pattern 18B. In the connection pad forming process, the connection pads 62 are formed at the same time when patterning is performed on the copper plating layer formed on the second insulating resin layer 17B to form the second wiring pattern 18B.

The external connection column forming process is a process of forming the external connection columns 53 on predetermined connection pads 62A formed on the surface 5A of the wiring layer 5 by a known pactel method or plated riser method of forming via columns by plating using a multi-layer wiring substrate technique. In the external connection column forming process, predetermined connection pads 62 are opened, a plating resist pattern is formed by using a dry film, and the pillar-shaped external connection columns 53 having a predetermined height are formed by an electrolytic copper plating method, as shown in FIG. 7. In the external connection column forming process, the external connection columns 53 may be formed of, for example, solder balls.

Figure 18:
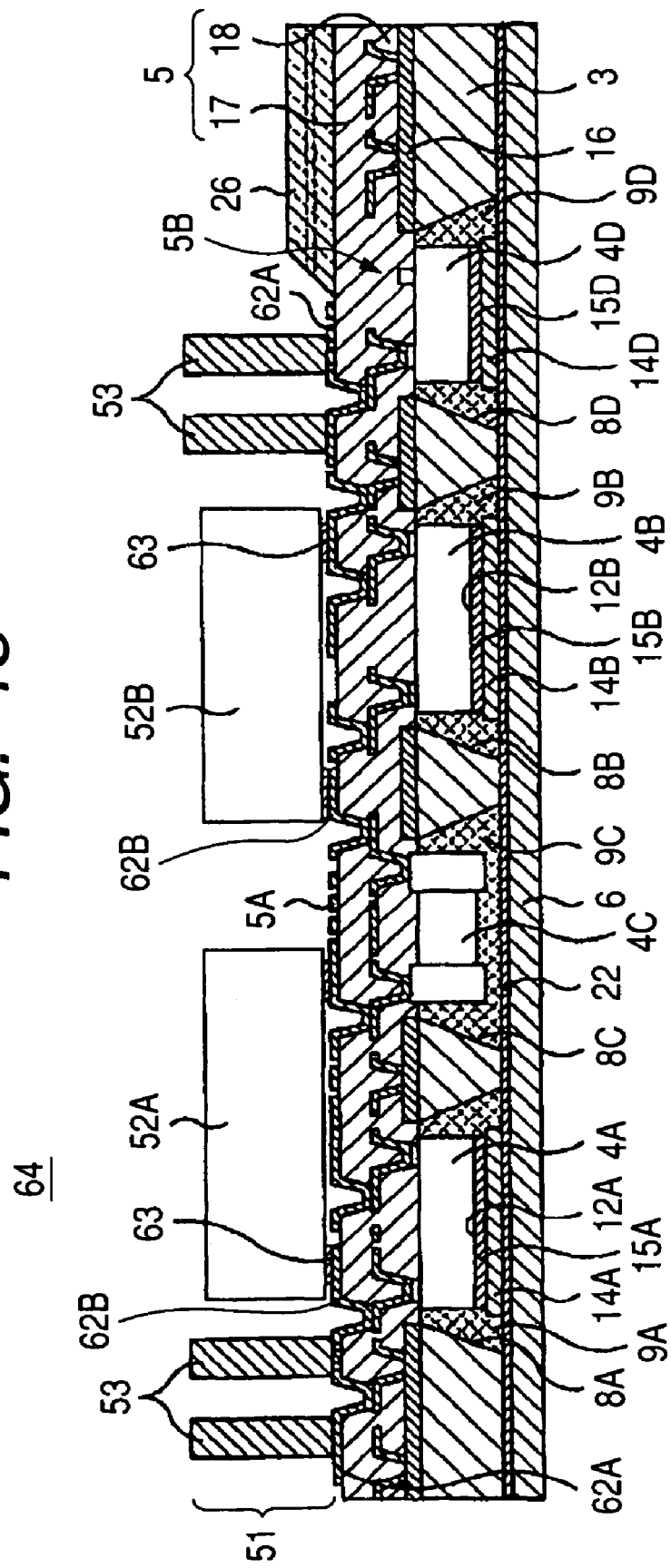
FIG. 18 is a cross-sectional view of a sixth intermediate in which second mounted parts are mounted on the wiring layer.

In the second part mounting process, the third LSI 52A and the fourth LSI 52B, serving as the second mounted parts 52, are formed on predetermined connection pads 62B formed on the surface 5A of the wiring layer 5 by a flip chip method. In the second part mounting process, the second mounted parts 52 are mounted on the surface 5A of the wiring layer 5 with the input/output portion forming portions having the input/output pads 63 for receiving/outputting electric signals formed thereon used as mounting surfaces. In the second part mounting process, as shown in FIG. 18, the second mounted parts 52 are mounted by bonding the input/output pads 63 to the corresponding to the connection pads 62B. As shown in FIG. 18, the thickness of the second mounted part 52 is smaller than the height of the external connection column 53.

In the optical waveguide member mounting process, as shown in FIG. 18, the optical waveguide member 26 is mounted on the surface 5A of the wiring layer 5. In the optical waveguide member mounting process, although not described in detail, an appropriate adhesive is applied onto an outer circumferential portion of the optical waveguide member 26, and the optical waveguide member 26 is bonded to the surface 5A of the wiring layer 5 such that one end forming the mirror surface is opposite to the optical signal transmitting path 5B of the wiring layer 5. As shown in FIG. 18, the other end of the optical waveguide member 26 extends toward the side. In the process of manufacturing the hybrid module 50, the second mounted parts 52, the external connection columns 53, and the optical waveguide member 26 are mounted to the surface 5A of the wiring layer 5 through the above-mentioned processes, thereby forming a sixth intermediate 64.

Figure 19:
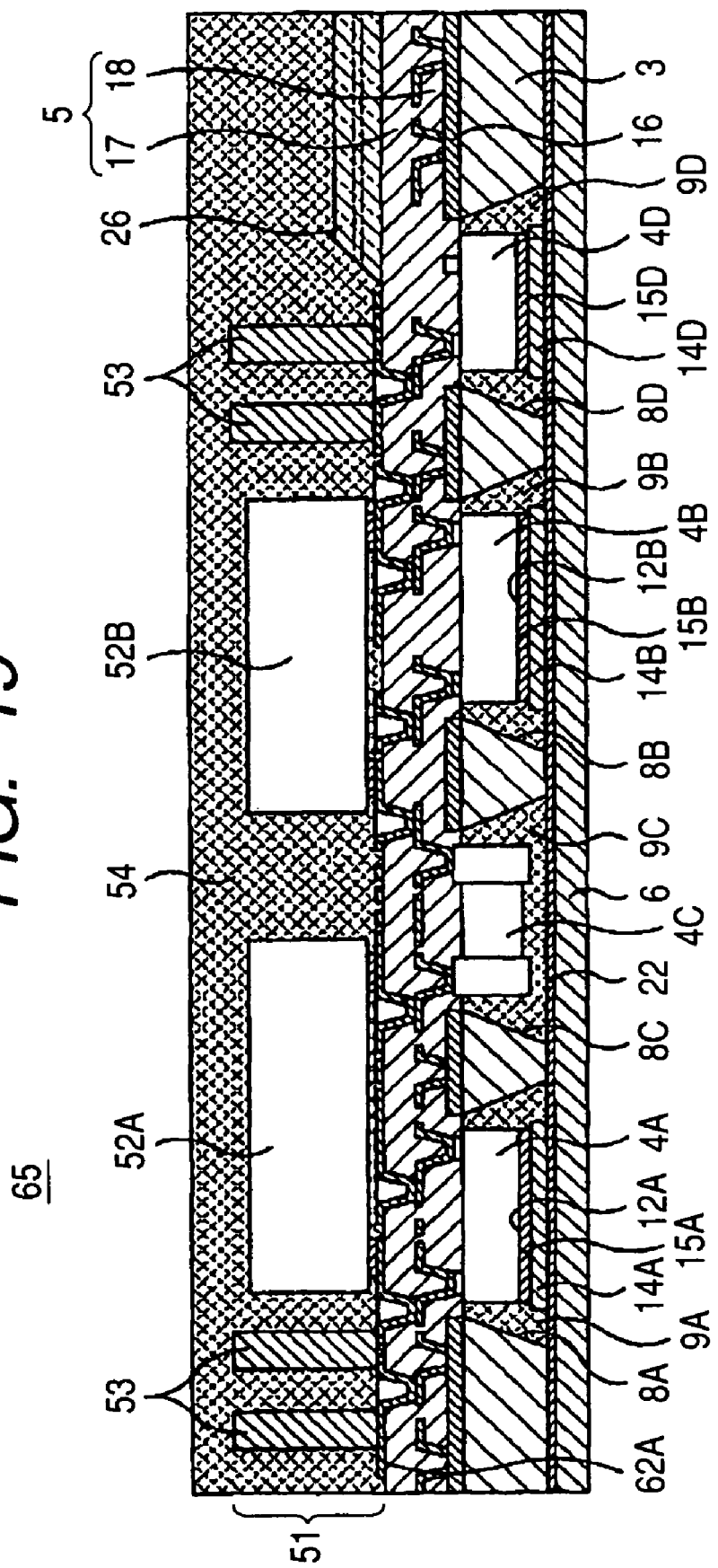
FIG. 19 is a cross-sectional view of a seventh intermediate having a second sealing layer formed therein.

In the second sealing layer forming process, the second sealing layer 54 is formed on the surface of the sixth intermediate 64 with a sufficient thickness to bury these mounted parts. In the second sealing layer forming process, the sixth intermediate 64 is put in a cavity, such as a mold, and the same insulating sealing resin as that forming the sealing resin layer 9, for example, a thermosetting liquid epoxy-based resin or a polyimide resin is filled into the cavity. Then, in the second sealing layer forming process, a hardening process, such as a heating process, is performed on the mold to harden the insulating sealing resin, which causes the second mounted parts 52, the external connection columns 53, and the optical waveguide member 26 to be buried in the second sealing layer 54, as shown in FIG. 19. In this way, a seventh intermediate 65 is formed. In the seventh intermediate 65, the second mounted parts 52, the external connection columns 53, and the optical waveguide member 26 are rigidly fixed to the surface 5A of the wiring layer 5 by the second sealing layer 54. In the second sealing layer forming process, the second sealing layer 54 may be formed by an appropriate resin packaging method used in various chip manufacturing processes.

Figure 20:
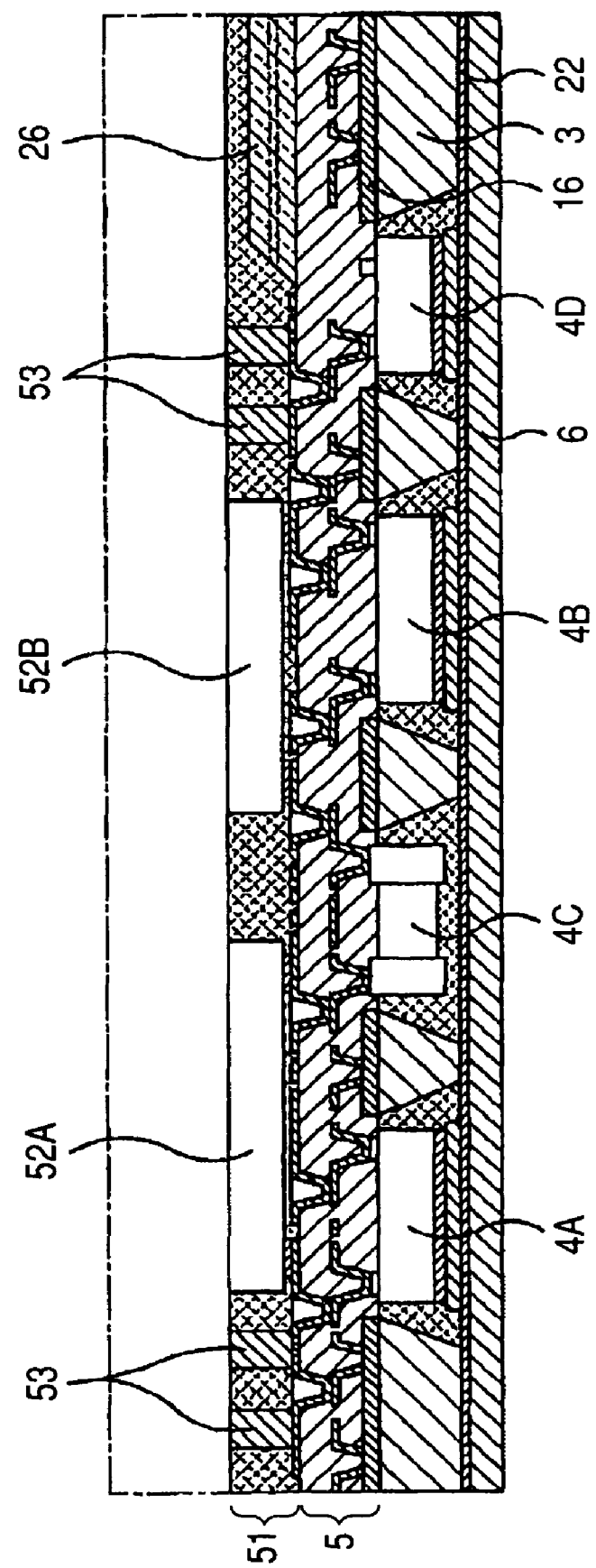
FIG. 20 is a cross-sectional view of an eighth intermediate in which the second sealing layer is polished.

In the second sealing layer polishing process, the surface of the second sealing layer 54 of the seventh intermediate 65 is polished to a predetermined thickness so that the upper end portions of the external connection columns 53 are exposed to the outside, thereby forming an eighth intermediate 66 shown in FIG. 20. In the second sealing layer polishing process, the second sealing layer 54 is polished from the surface to the wiring layer 5 by, for example, a mechanical/chemical polishing method, and the eight intermediate 66 has a relatively high mechanical rigidity due to the silicon substrate 3 or the heat dissipating plate 6 mounted therein, which enables effective and high-accuracy polishing.

In the second sealing layer polishing process, the second sealing layer 54 is continuously polished even after the upper end portions of the external connection columns 53 are exposed. In the second sealing layer polishing process, back surface polishing is performed on the third LSI 52A and the fourth LSI 52B mounted in the second sealing layer 54 with the bottom surfaces facing the surface of the second sealing layer 54 in the thickness range in which the functions of the first and second LSIs 52A and 52B are not damaged, which is represented by a one-dot chain line in FIG. 20, thereby reducing the overall thickness of the eighth intermediate 66. In the second sealing layer polishing process, as shown in FIG. 20, the second sealing layer 54 is polished so as to be flush with the upper end surfaces of the external connection columns 53 and the bottom surfaces of the third LSI 52A and the fourth LSI 52B, thereby forming the eighth intermediate 66.

In the connection bump forming process, the connection bumps 55 are formed on the upper end surfaces of the external connection columns 53 exposed from the polished surface of the second sealing layer 54. In the connection bump forming process, the connection bumps 55 having a predetermined height are formed on the external connection columns 53 by, for example, a gold pattern plating method. In the connection bump forming process, for example, solder balls or metal balls may be provided on the upper end surfaces of the connection bumps 55, according to a mounting method with respect to the wiring substrate 56.

In the hybrid module manufacturing method, the hybrid module 50 formed through the above-mentioned processes is mounted to the wiring substrate 56, thereby manufacturing the hybrid circuit device 58 shown in FIG. 16. In the hybrid module manufacturing process, the hybrid module 50 is mounted to the wiring substrate 56 by, for example, an ultrasonic welding method, with the connection bumps 59 aligned with the corresponding lands, thereby manufacturing the hybrid circuit device 58. In the hybrid circuit device 58, the heat spreader 23 is bonded to the heat dissipating plate 6 of the hybrid module 58, and the optical connector 60 is coupled to the end of the optical waveguide member 26.

In the hybrid module manufacturing process, a plurality of mounted parts 4 are mounted to one surface of the wiring layer 5, and a plurality of second mounted parts 52 are mounted to the other surface of the wiring layer 5, thereby manufacturing the hybrid module 50. In the hybrid module manufacturing process, the mounted parts 4 and the second mounted parts 52 are connected to each other through the wiring layer 52 at the shortest distance, whereby parasitic capacitance due to the wiring pattern is reduced. Therefore, it is possible to manufacture the hybrid module 50 having improved characteristics.

The hybrid module manufacturing process manufactures the hybrid module 50 in which the mounted parts 4 are mounted in the silicon substrate 3, the second mounted parts 52 are mounted in the second sealing layer 54, and the second sealing layer 54 is polished to a minimum thickness by back polishing. Therefore, in the hybrid module manufacturing process, since a plurality of mounted parts 4 and 52 are provided in the hybrid module 50, it is possible to manufacture a multi-function and high-performance hybrid module 50 having small thickness and size.

In the hybrid module 50 manufactured by the hybrid module manufacturing process, the mounted parts 4 are mounted in the silicon substrate 3 that is hardly deformed due to heat, the wiring layer 5 is formed on the first main surface 3A of the silicon substrate 3, and the second part mounting layer 51 in which the second mounted parts 52 are sealed by the second sealing layer 54 is formed on the wiring layer 5. In the hybrid module manufacturing process, the deformation of the silicon substrate 3 due to heat is prevented in the etching process or a reflow soldering process of mounting the hybrid module to the wiring substrate 56, and thus the mounted parts 4 and the second mounted parts 52 are accurately mounted in the silicon substrate 3 and the second part mounting layer 51, respectively. Therefore, the mounted parts 4 and the second mounted parts 52 are reliably connected to the wiring layer 5, and thus the breaking of wiring lines is prevented, which makes it possible to manufacture the hybrid module 50 having higher reliability.

In the hybrid module manufacturing process, the silicon substrate 3 serves as the ground of the mounted parts 4, the second mounted parts 52, or the wiring layer 5 and has a function of effectively dissipating heat, which makes it possible to manufacture the hybrid module 50 that can be stably operated. Further, in the hybrid module manufacturing process, the individual heat dissipating plates 14 are bonded to the mounted parts 4 requiring the dissipation of heat, and the heat dissipating plate 6 having a large size is also provided, which makes it possible to manufacture the hybrid module 50 having a good heat dissipating characteristic in which heat generated from the second mounted parts 52 is dissipated through the wiring layer 5 at the shortest distance.

The hybrid module 50 has the optical element 4D mounted in the silicon substrate 3 as the mounted part 4, and has an electric signal processing function of transmitting/receiving electrical control signals or data signals or supplying power and an optical signal processing function of transmitting/receiving optical control signals or data signals. However, the invention is not limited thereto. For example, the hybrid module 50 may have only the electric signal processing function. In this case, it is unnecessary that the insulating layer be formed of a light-transmitting insulating resin material.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a hybrid module, comprising:
   a part mounting opening forming step of forming in a silicon substrate a plurality of part mounting openings composed of through holes passing through first and second main surfaces of a silicon substrate;
   a mounted part integrating step of integrating the mounted parts with the silicon substrate by mounting the mounted parts in the part mounting openings such that input/output portion forming surfaces are substantially flush with the first main surface of the silicon substrate; and
   a wiring layer forming step of forming a wiring layer on the first main surface of the silicon substrate so as to cover the mounted parts,
   wherein the mounted part integrating step includes:
   a silicon substrate mounting step of bonding the silicon substrate to a dummy substrate, using the first main surface as a bonding surface, such that portions of the part mounting openings exposed from the first main surface are blocked;
   a part mounting step of mounting the mounted parts in the part mounting openings of the silicon substrate from the second main surface, using the input/output portion forming surfaces as mounting surfaces, such that the input/output portion forming surfaces are substantially flush with each other on the dummy substrate;
   a sealing layer forming step of hardening a sealing material filled into the part mounting openings to form a sealing layer, and of fixing the mounted parts in the part mounting openings by using the sealing layer; and
   a peeling step of peeling the silicon substrate from the dummy substrate, and
   the mounted parts are mounted in the part mounting openings such that the output/input portion forming surfaces are exposed in a state in which they are substantially flush with the first main surface of the silicon substrate.

2. The method of manufacturing a hybrid module according to claim 1,
   wherein, in the part mounting opening forming step, an anisotropic etching process is performed on the second main surface of the silicon substrate having a surface orientation of 100 to form the part mounting openings, and
   the part mounting opening is formed in a trapezoidal shape in sectional view in which a surface flush with the second main surface has a larger diameter and an outer circumferential surface is tapered toward the first main surface.

3. The method of manufacturing a hybrid module according to claim 1, further comprising:

a silicon substrate polishing step of polishing the silicon substrate to a thickness that is substantially equal to or larger than a maximum thickness of the mounted part, wherein the silicon substrate polishing step is performed before the part mounting opening forming step.

4. The method of manufacturing a hybrid module according to claim 1, further comprising:

a sealing layer polishing step of polishing the sealing layer such that the second main surface of the silicon substrate or the bottom surfaces of the mounted parts are exposed, wherein the sealing layer polishing step is performed after the sealing layer forming step.

5. The method of manufacturing a hybrid module according to claim 4, further comprising:

a reinforcing plate member bonding step of bonding a reinforcing plate member to the entire polished surface, wherein the reinforcing plate member bonding step is performed after the sealing layer polishing step.

6. The method of manufacturing a hybrid module according to claim 5, wherein, in the reinforcing plate member bonding step, the reinforcing plate member is composed of a metal plate having high thermal conductivity, and the reinforcing plate member also serves as a heat dissipating member for dissipating heat generated from the mounted parts.

7. The method of manufacturing a hybrid module according to claim 1, wherein, in the part mounting step, the mounted parts having different characteristics are mounted in the part mounting openings.

8. The method of manufacturing a hybrid module according to claim 1, further comprising:

a conductive layer forming step of forming a conductive layer on the entire first main surface of the silicon substrate, wherein the conductive layer forming step is performed before the part mounting opening forming step, and the conductive layer remaining on the first main surface of the silicon substrate through the part mounting opening forming step electrically connects the silicon substrate to a predetermined wiring pattern of the wiring layer, so that the remaining conductive layer forms a conductive pattern layer for causing the silicon substrate to serve as a power supply portion or a ground portion.

9. The method of manufacturing a hybrid module according to claim 1, wherein the wiring layer forming step includes:

an insulating layer forming step of forming an insulating layer on the first main surface of the silicon substrate;

a copper plating layer forming step of performing a copper plating process on the insulating layer to form a copper plating layer;

a patterning step of patterning the copper plating layer to form a copper wiring pattern; and a via forming step of forming vias for connecting the copper wiring pattern to electrode pads provided on the input/output portion forming surfaces of the mounted parts, whereby at least one wiring layer is formed through the insulating layer forming step, the copper plating layer forming step, the patterning step, and the via forming step, and the method of manufacturing a hybrid module further includes an external connection pad forming step of forming external connection pads on the uppermost layer of the wiring layer.

10. The method of manufacturing a hybrid module according to claim 1, wherein the wiring layer forming step includes a connection pad forming step of at least one wiring layer through:

an insulating layer forming step of forming an insulating layer on the first main surface of the silicon substrate;

a copper plating layer forming step of performing a copper plating process on the insulating layer to form a copper plating layer;

a patterning step of patterning the copper plating layer to form a copper wiring pattern; and a via forming step of forming vias for connecting the copper wiring pattern to electrode pads provided on the input/output portion forming surfaces of the mounted parts, and forming a plurality of connection pads connected to the input/output portions of the respective mounted parts through the vias on the uppermost layer, the method of manufacturing a hybrid module further includes:

a part mounting step of mounting a plurality of second mounted parts on the uppermost layer of the wiring layer through the connection pads; and an external connection column forming step of forming a plurality of external connection columns, the part mounting step and the external connection column forming step being performed after the wiring layer forming step.

11. The method of manufacturing a hybrid module according to claim 10, further comprising:

a second sealing material layer forming step of forming on the uppermost layer of the wiring layer a second sealing material layer made of a sealing material so as to cover the second mounted parts and the external connection columns; and a second sealing layer forming step of polishing the second sealing material layer such that upper end surfaces of the external connection columns are exposed to form a second sealing layer, wherein the second sealing material layer forming step and the second sealing layer forming step are performed after the part mounting step and the external connection column forming step.

* * * * *